US 12,476,128 B2

(12) United States Patent
Woo

(10) Patent No.: US 12,476,128 B2
(45) Date of Patent: Nov. 18, 2025

(54) WAFER STORAGE CONTAINER

(71) Applicant: Bum Je Woo, Seongnam-si (KR)

(72) Inventor: Bum Je Woo, Seongnam-si (KR)

( * ) Notice: Subject to any disclaimer, the term of this patent is extended or adjusted under 35 U.S.C. 154(b) by 0 days.

(21) Appl. No.: 18/350,546

(22) Filed: Jul. 11, 2023

(65) Prior Publication Data

US 2024/0021454 A1    Jan. 18, 2024

(30) Foreign Application Priority Data

Jul. 18, 2022    (KR) .......................... 10-2022-0087947

(51) Int. Cl.
H01L 21/673    (2006.01)

(52) U.S. Cl.
CPC .. *H01L 21/67393* (2013.01); *H01L 21/67383* (2013.01); *H01L 21/67386* (2013.01)

(58) Field of Classification Search
CPC ......... H01L 21/67383; H01L 21/67386; H01L 21/67393; H01L 21/67389
USPC ....................................................... 206/711
See application file for complete search history.

(56) References Cited

U.S. PATENT DOCUMENTS

| 11,355,371 | B2 * | 6/2022 | Woo | ................ | H01L 21/67393 |
| 2019/0311929 | A1 * | 10/2019 | Woo | ...................... | H01L 21/67 |
| 2021/0166962 | A1 * | 6/2021 | Woo | ................ | H01L 21/67393 |
| 2023/0349574 | A1 * | 11/2023 | Wu | ......................... | F24F 9/00 |

FOREIGN PATENT DOCUMENTS

| KR | 10-2010-0134033 A | 12/2010 |
| KR | 10-1608834 B1 | 4/2016 |
| KR | 10-2018-0107500 A | 10/2018 |
| KR | 10-2066175 B1 | 1/2020 |
| KR | 10-2113275 B1 | 5/2020 |
| KR | 10-2020-0084852 A | 7/2020 |

OTHER PUBLICATIONS

Office Action for Korean Patent Application No. 10-2022-0087947, dated Feb. 14, 2024.
The Written Decision on Registration for Korean Patent Application No. 10-2022-0087947, dated Aug. 27, 2024.
Written Decision on Registration for Korean Patent Application No. 10-2024-0171327, dated Jul. 22, 2025.

* cited by examiner

*Primary Examiner* — Rafael A Ortiz

(57) ABSTRACT

Proposed is a wafer storage container that is connected to a wafer transfer chamber of an EFEM and supplies a purge gas to wafers to remove fumes from the wafers or to control humidity of the wafers. More particularly, proposed is a wafer storage container that effectively blocks an external gas from flowing into a storage chamber, while effectively achieving fume removal and humidity control for wafers.

12 Claims, 15 Drawing Sheets

WAFER STORAGE CONTAINER

CROSS REFERENCE TO RELATED APPLICATION

The present application claims priority to Korean Patent Application No. 10-2022-0087947, filed Jul. 18, 2022, the entire contents of which is incorporated herein for all purposes by this reference.

BACKGROUND OF THE INVENTION

Field of the Invention

The present disclosure relates to a wafer storage container that is connected to a wafer transfer chamber of an EFEM and supplies a purge gas to wafers to remove fumes from the wafers or to control humidity of the wafers.

Description of the Related Art

In general, a semiconductor device is manufactured by selectively and repeatedly performing a series of processes, such as deposition, polishing, photolithography, etching, ion implantation, cleaning, inspection, heat treatment, and the like, on a wafer. For this purpose, the wafer is transferred to a specific location required in each process.

Wafers are high-precision products. These wafers are stored or transferred in a wafer storage container such as a front opening unified pod (FOUP) to prevent contamination or damage from external contaminants and shocks.

The wafer storage container is connected to the wafer transfer chamber of an equipment front end module (EFEM). A wafer that has completed a semiconductor manufacturing process is transferred and stored in the wafer storage container by a robot arm provided in the wafer transfer chamber.

Process gases used in the process and fumes, which are by-products of the process, may remain on the surface of the completed wafer without being removed. To remove the fumes remaining on the wafer surface, a fan such as a fan filter unit (FFU) is used to generate a downward flow of a purge gas inside the wafer transfer chamber of the EFEM.

Such a downward flow is introduced as an external gas into the wafer storage container.

The downward flow generated through the FFU is a gas that guarantees cleanliness like the purge gas, but it is contaminated by the fumes on the wafer transferred from a process chamber. Thus, the downward flow becomes a contaminated external gas and is introduced into the wafer storage container.

The external gas introduced into a storage chamber of the wafer storage container contaminates the wafer, and causes wafer defects due to its high humidity. In the case of a conventional wafer storage container, the wafer storage container itself supplies a purge gas to block introduction of a downward flow to some extent. However, since an external gas is introduced in the form of a downward flow, the external gas may be intensively introduced into the lower area of the storage chamber due to turbulence despite supply of the purge gas.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2010-0134033

SUMMARY OF THE INVENTION

Accordingly, the present disclosure has been made keeping in mind the above problems occurring in the related art, and an objective of the present disclosure is to provide a wafer storage container that effectively blocks an external gas from flowing into a storage chamber, while effectively achieving fume removal and humidity control for wafers.

In order to achieve the above objective, according to one aspect of the present disclosure, there is provided a wafer storage container connected to a wafer transfer chamber of an EFEM, the wafer storage container including: a storage chamber having a front opening at a front side thereof, configured to store therein, through the front opening, a plurality of wafers transferred from the wafer transfer chamber, and having an inside divided in a vertical direction into a first purging region and a second purging region located above the first purging region; a plurality of shelves provided in the vertical direction inside the storage chamber to support the plurality of wafers; first and second rear chambers forming a rear surface of the storage chamber, corresponding to the first and second purging regions, respectively, having a plurality of first rear holes and a plurality of second rear holes on respective inner surfaces thereof, respectively, and configured to individually receive a purge gas and individually inject the purge gas to the first and second purging regions, respectively, through the plurality of first rear holes and the plurality of second rear holes, respectively; and a controller configured to control an injection pressure of the purge gas injected from each of the first and second rear chambers, according to which purging region a wafer is stored in among the first and second purging regions.

In addition, the inside of the storage chamber may be divided into the first purging region, the second purging region, and a third purging region located above the second purging region. The wafer storage container may further include a third rear chamber forming the rear surface of the storage chamber, corresponding to the third purging region, having a plurality of third rear holes on an inner surface thereof, and configured to individually receive the purge gas and individually inject the purge gas to the third purging region through the plurality of third rear holes. The controller may control an injection pressure of the purge gas injected from each of the first to third rear chambers, according to which purging region the wafer is stored in among the first to third purging regions.

In addition, when the wafer is stored only in the first purging region among the first to third purging regions, the purge gas may not be injected from the third rear chamber to the third purging region, and the injection pressure of the purge gas injected from the first rear chamber to the first purging region may be higher than that of the purge gas injected from the second rear chamber to the second purging region.

In addition, when the wafer is stored only in the second purging region among the first to third purging regions, the injection pressure of the purge gas injected from the second rear chamber to the second purging region may be higher than that of the purge gas injected from the first rear chamber to the first purging region and that of the purge gas from the third rear chamber to the third purging region.

In addition, when the wafer is stored only in the third purging region among the first to third purging regions, the purge gas may not be injected from the first rear chamber to the first purging region, and the injection pressure of the purge gas injected from the third rear chamber to the third purging region may be higher than that of the purge gas injected from the second rear chamber to the second purging region.

In addition, when the wafer is not stored in the third purging region but stored only in the first purging region and the second purging region among the first to third purging regions, the following relationship may be satisfied: "the injection pressure of the purge gas injected from the second rear chamber to the second purging region>the injection pressure of the purge gas injected from the first rear chamber to the first purging region>the injection pressure of the purge gas injected from the third rear chamber to the third purging region".

In addition, when the wafer is not stored in the first purging region but stored only in the second purging region and the third purging region among the first to third purging regions, the following relationship may be satisfied: "the injection pressure of the purge gas injected from the second rear chamber to the second purging region>the injection pressure of the purge gas injected from the third rear chamber to the third purging region>the injection pressure of the purge gas injected from the first rear chamber to the first purging region".

In addition, the wafer storage container may further include: first and second left chambers forming a left surface of the storage chamber, corresponding to the first and second purging regions, respectively, having a plurality of first left holes and a plurality of second left holes on respective inner surfaces thereof, respectively, and configured to individually receive the purge gas and individually inject the purge gas to the first and second purging regions, respectively, through the plurality of first left holes and the plurality of second left holes, respectively; and first and second right chambers forming a right surface of the storage chamber, corresponding to the first and second purging regions, respectively, having a plurality of first right holes and a plurality of second right holes on respective inner surfaces thereof, respectively, and configured to individually exhaust the purge gas in the first and second purging regions through the plurality of first right holes and the plurality of second right holes, respectively. The controller may control an injection pressure of the purge gas injected from each of the first and second left chambers and an exhaust pressure of the purge gas exhausted through each of the first and second right chambers, according to which purging region the wafer is stored in among the first and second purging regions.

In addition, the inside of the storage chamber may be divided into the first purging region, the second purging region, and a third purging region located above the second purging region. The wafer storage container may further include: a third rear chamber forming the rear surface of the storage chamber, corresponding to the third purging region, having a plurality of third rear holes on an inner surface thereof, and configured to individually receive the purge gas and individually inject the purge gas to the third purging region through the plurality of third rear holes; a third left chamber forming a left surface of the storage chamber, corresponding to the third purging region, having a plurality of third left holes on an inner surface thereof, and configured to individually receive the purge gas and individually inject the purge gas to the third purging region through the plurality of third left holes; and a third right chamber forming a right surface of the storage chamber, corresponding to the third purging region, having a plurality of third right holes on an inner surface thereof, and configured to individually exhaust the purge gas in the third purging region through the plurality of third right holes. The controller may control an injection pressure of the purge gas injected from each of the first to third rear chambers, an injection pressure of the purge gas injected from each of the first to third left chambers, and an exhaust pressure of the purge gas exhausted through each of the first to third right chambers, according to which purging region the wafer is stored in among the first to third purging regions.

In addition, the wafer storage container may further include: first to third left rear chambers forming a left rear surface of the storage chamber, corresponding to the first to third purging regions, respectively, having a plurality of first left rear holes, a plurality of second left rear holes, and a plurality of third left rear holes on respective inner surfaces thereof, respectively, and configured to individually receive the purge gas and individually inject the purge gas to the first to third purging regions, respectively, through the plurality of first left rear holes, the plurality of second left rear holes, and the plurality of third left rear holes, respectively; and first to third right rear chambers forming a right rear surface of the storage chamber, corresponding to the first to third purging regions, respectively, having a plurality of first right rear holes, a plurality of second right rear holes, and a plurality of third right rear holes on respective inner surfaces thereof, respectively, and configured to individually receive the purge gas and individually inject the purge gas to the first to third purging regions, respectively, through the plurality of first right rear holes, the plurality of second right rear holes, and the plurality of third right rear holes, respectively. The controller may control an injection pressure of the purge gas injected from each of the first to third left rear chambers and an injection pressure of the purge gas injected from each of the first to third right rear chambers, according to which purging region the wafer is stored in among the first to third purging regions.

In addition, the left rear chamber may have a shape inclined right toward a rear side of the storage chamber, and the right rear chamber may have a shape inclined left toward the rear side of the storage chamber.

The wafer storage container according to the present disclosure having the above configuration has the following effects.

A purge gas injected from a first side surface and a rear surface of the storage chamber is exhausted to a second side surface of the storage chamber. Thus, a flow of the purge gas is generated inside the storage chamber, and at the same time, an external gas is exhausted to the second side surface of the storage chamber, thereby effectively blocking the external gas from flowing into the storage chamber.

The flow of the purge gas inside the storage chamber can prevent turbulence from being generated inside the storage chamber. This enables the purge gas to be injected and flow evenly over the entire wafer, thereby minimizing dead areas on the wafer where the purge gas is not injected. Thus, fume removal and humidity control for the wafer can be more effectively achieved.

The inside of the storage chamber is divided into a plurality of regions in the vertical and horizontal directions, and the purge gas is individually injected to and exhausted from the plurality of divided regions through a plurality of chambers individually supplied with the purge gas, thereby achieving individual injection and exhaust of the purge gas inside the storage chamber. Thus, injection of the purge gas and exhaust of the purge gas and fumes can be performed only in a desired region.

Convection between the purge gas and the external gas generated inside the storage chamber can be effectively prevented.

Injection and exhaust of the purge gas are controlled according to the position of the wafer, thereby effectively preventing a downward flow in the wafer transfer chamber of the EFEM from flowing into the wafer storage container and thus preventing the wafer from being damaged due to high humidity and fumes.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
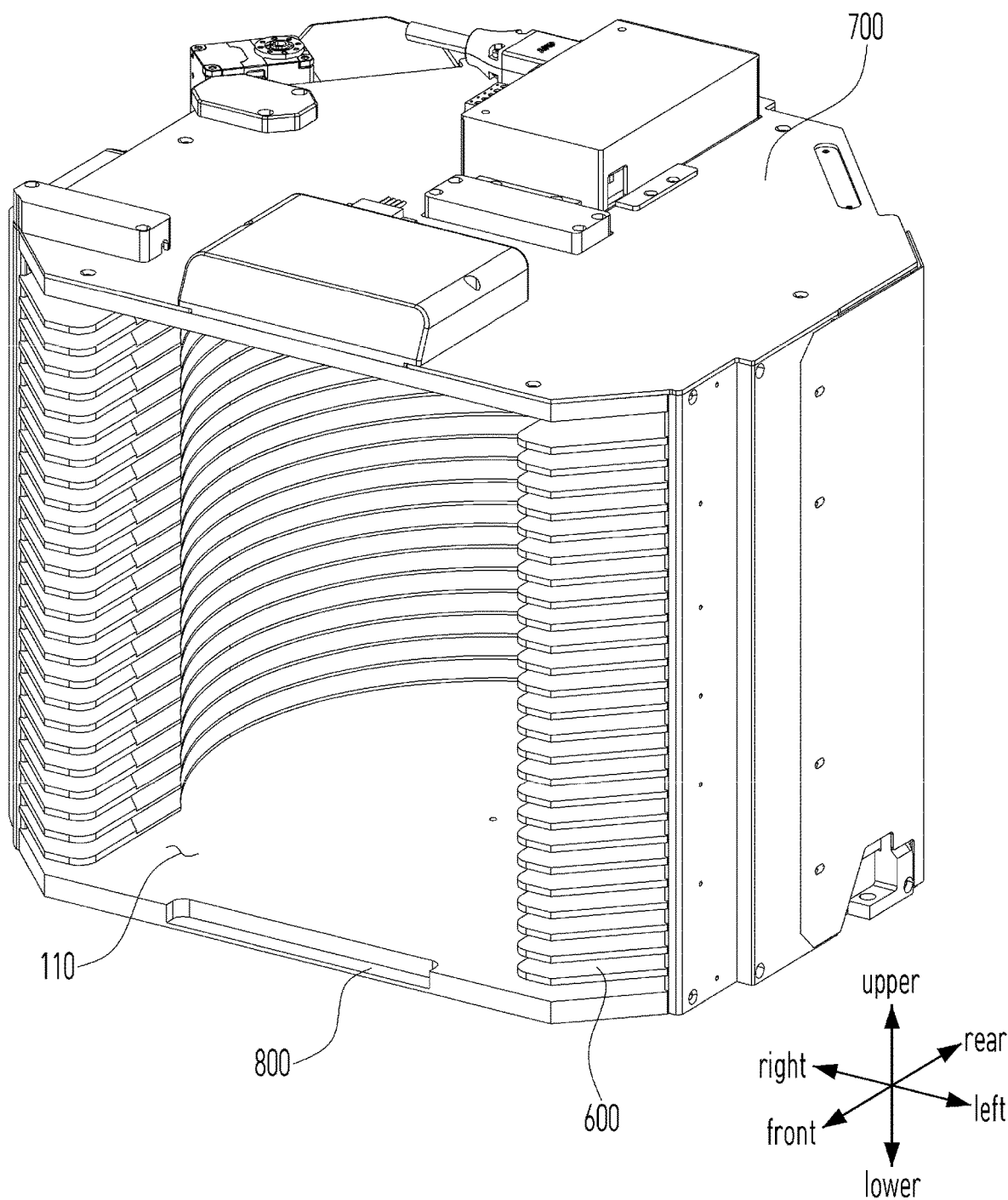
FIG. 1 is a perspective view illustrating a wafer storage container according to the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to sectional views and/or perspective views which schematically illustrate ideal embodiments of the present disclosure. For explicit and convenient description of the technical content, thicknesses of layers and regions in these drawings may be exaggerated. Therefore, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. The terms used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc., when used herein, specify the presence of stated features, integers, steps, operations, elements, components, and/or combinations thereof but do not preclude the presence or addition of one or more other features, integers, steps, operations, elements, components, and/or combinations thereof.

Hereinbelow, exemplary embodiments of the present disclosure will be described in detail with reference to the accompanying drawings. Wherever possible, the same reference numerals will be used throughout different embodiments and the description to refer to the same or like elements or parts. In addition, the configuration and operation already described in other embodiments will be omitted for convenience.

A "purge gas" referred to below is a general team for an inert gas for removing fumes, and in particular, may be nitrogen ($N_2$) gas, which is one of inert gases.

In addition, "purging" is a general term for preventing oxidation of a wafer by injecting a purge gas to the wafer to remove fumes remaining on the surface of the wafer or to remove moisture inside a storage chamber.

Hereinbelow, a wafer storage container 10 according to the present disclosure will be described with reference to FIGS. 1 to 15.

Figure 2:
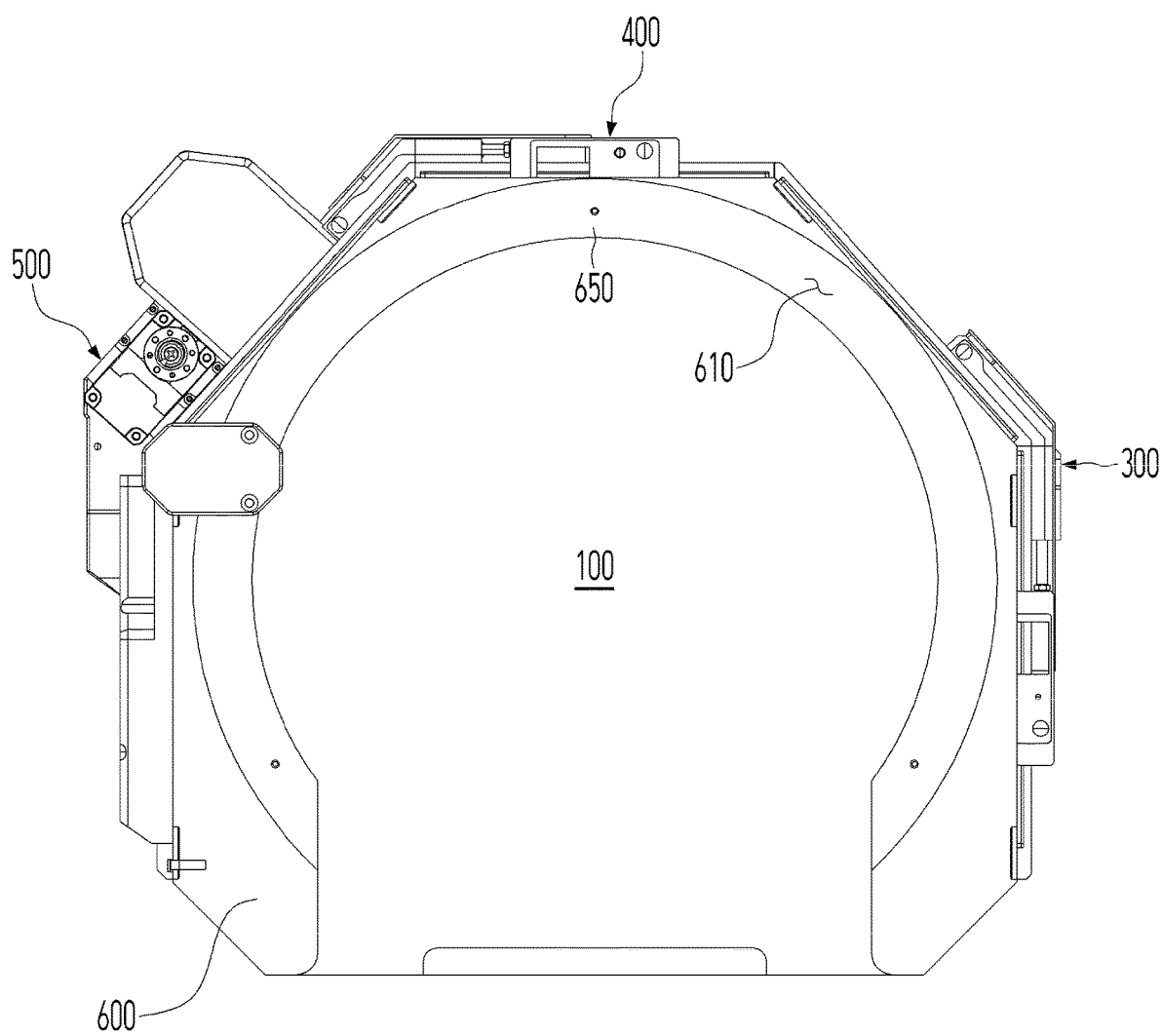
FIG. 2 is a plan sectional view illustrating the inside of a storage chamber of the wafer storage container illustrated in FIG. 1.
Figure 3:
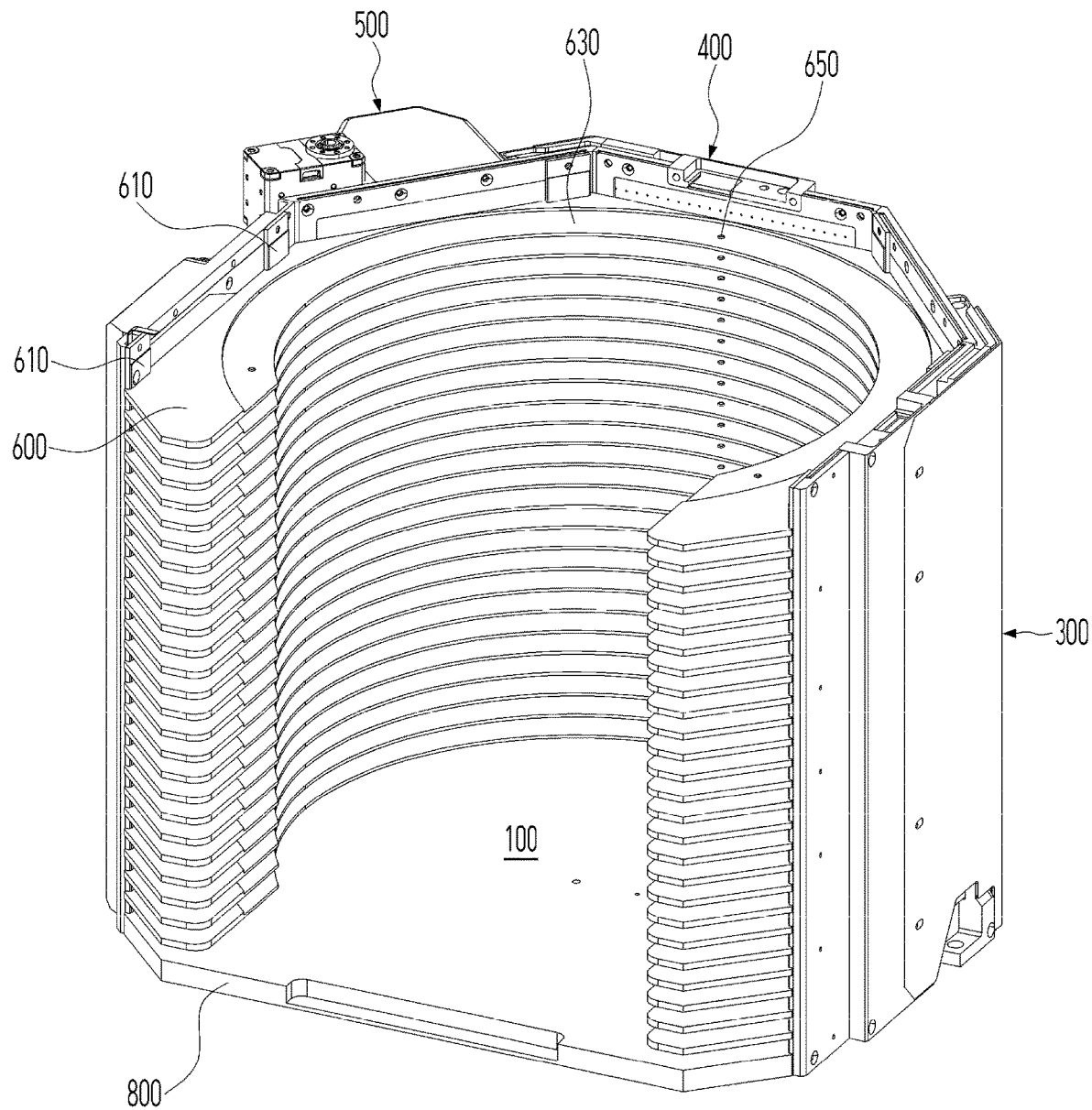
FIG. 3 is a perspective view illustrating a state in which an upper plate of the wafer storage container illustrated in FIG. 1 is removed.
Figure 4:
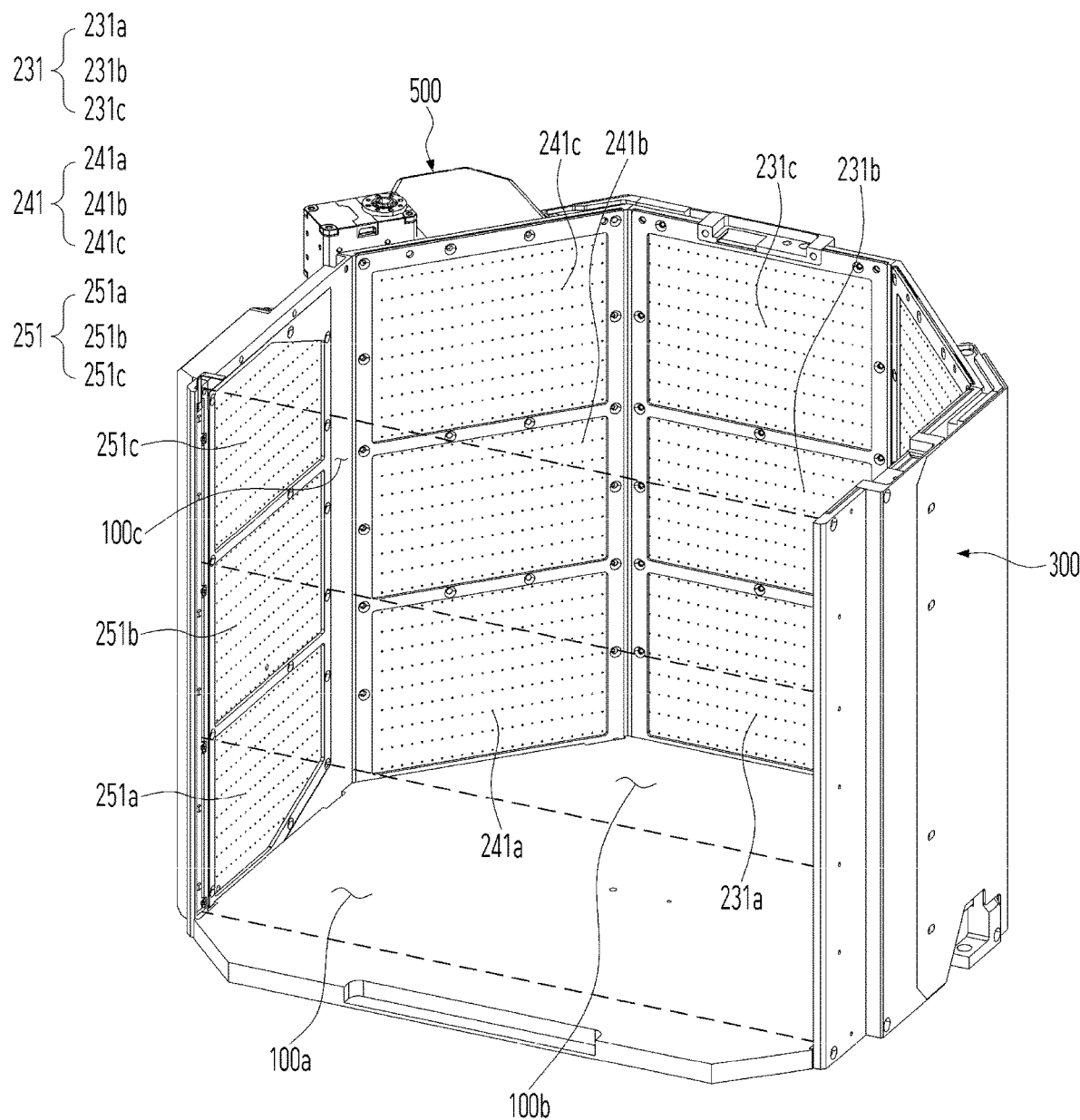
FIGS. 4 and 5 are views illustrating the inside of the wafer storage container with shelves removed in the state of FIG. 3.
Figure 5:
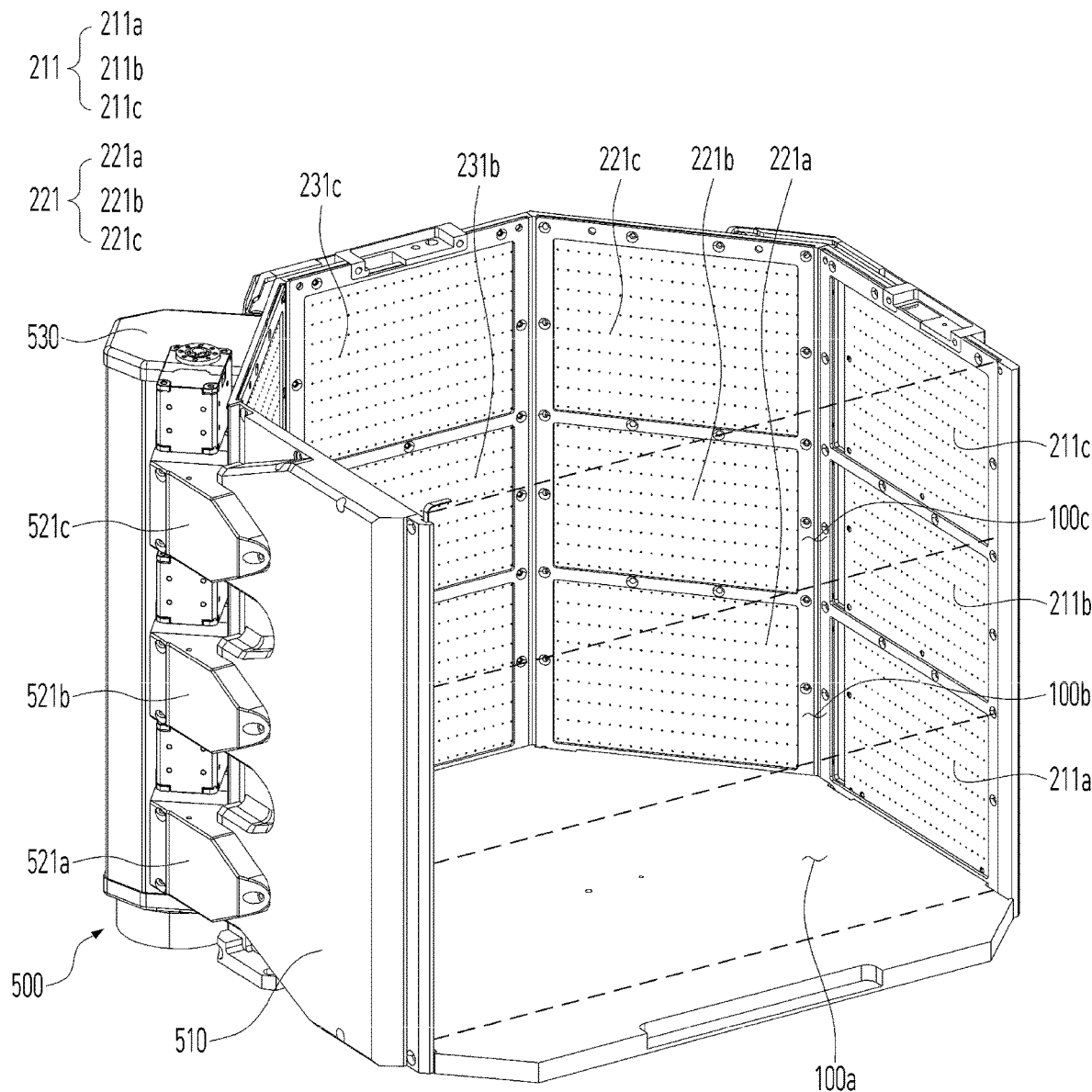
Figure 6:
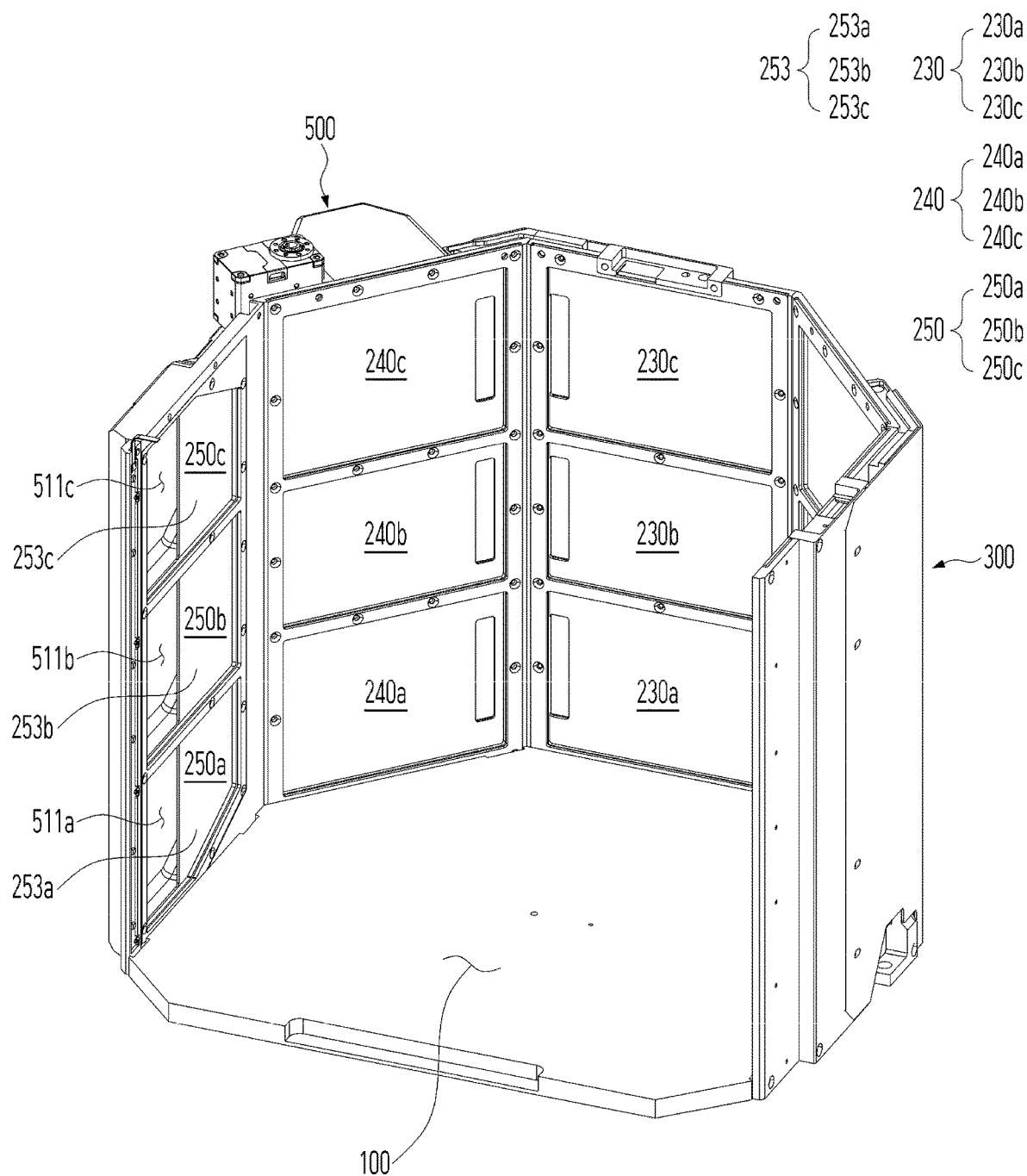
FIGS. 6 and 7 are views illustrating a left chamber, a right chamber, a left rear chamber, a right rear chamber, and a rear chamber of the wafer storage container illustrated in FIG. 1.
Figure 7:
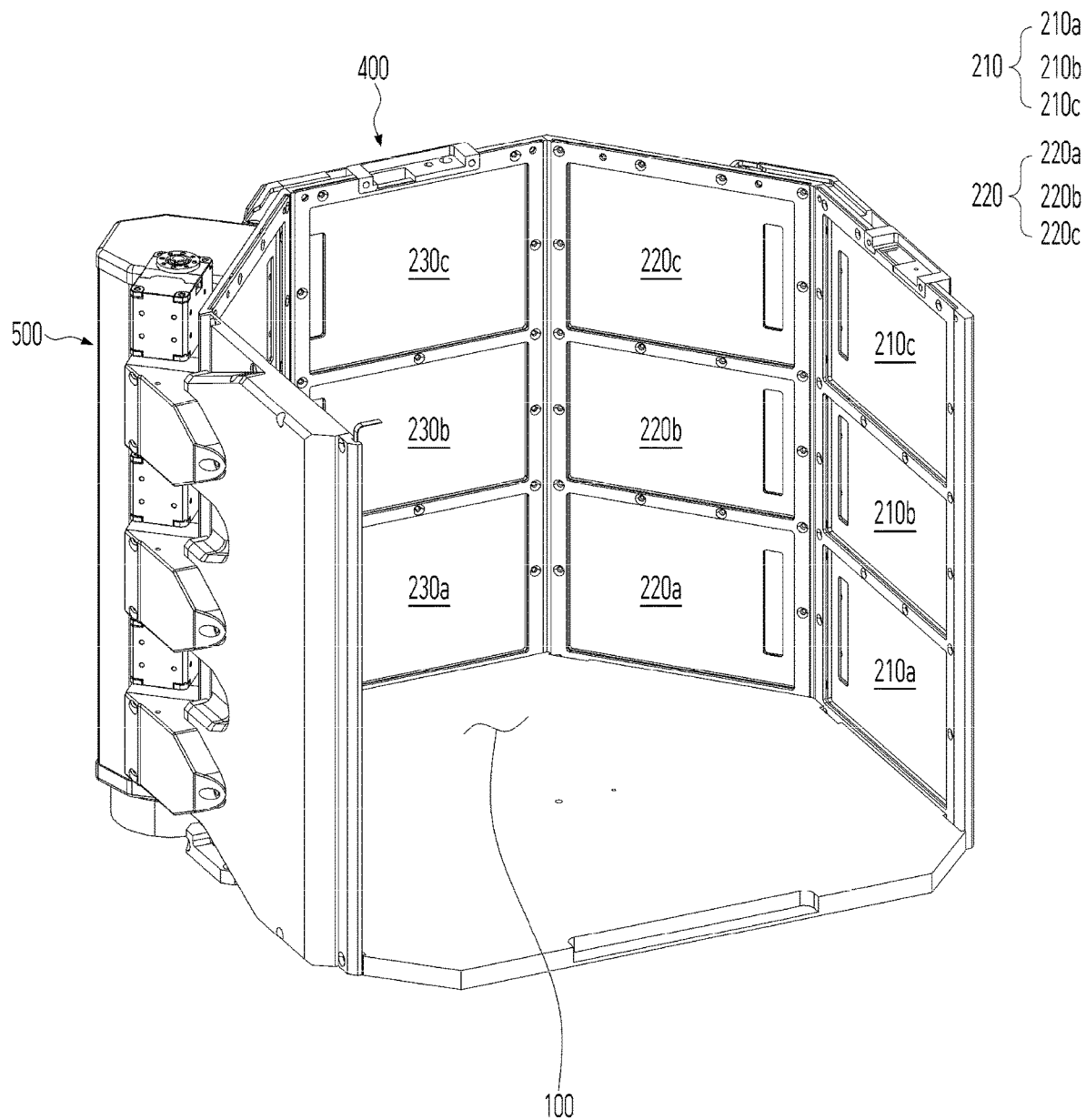
Figure 8:
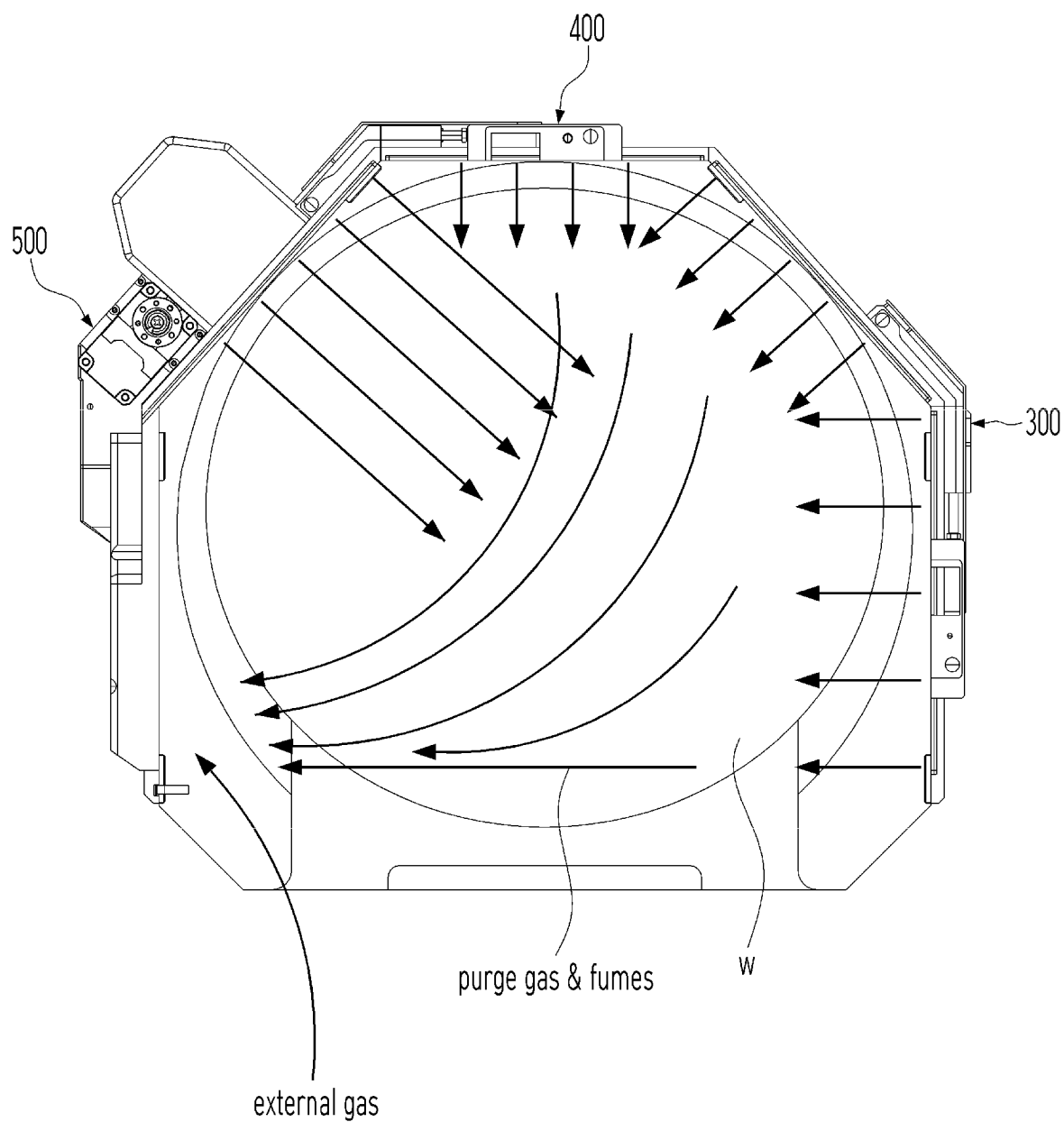
FIG. 8 is a view illustrating the flow of a purge gas inside the storage chamber of the wafer storage container according to the present disclosure.
Figure 9:
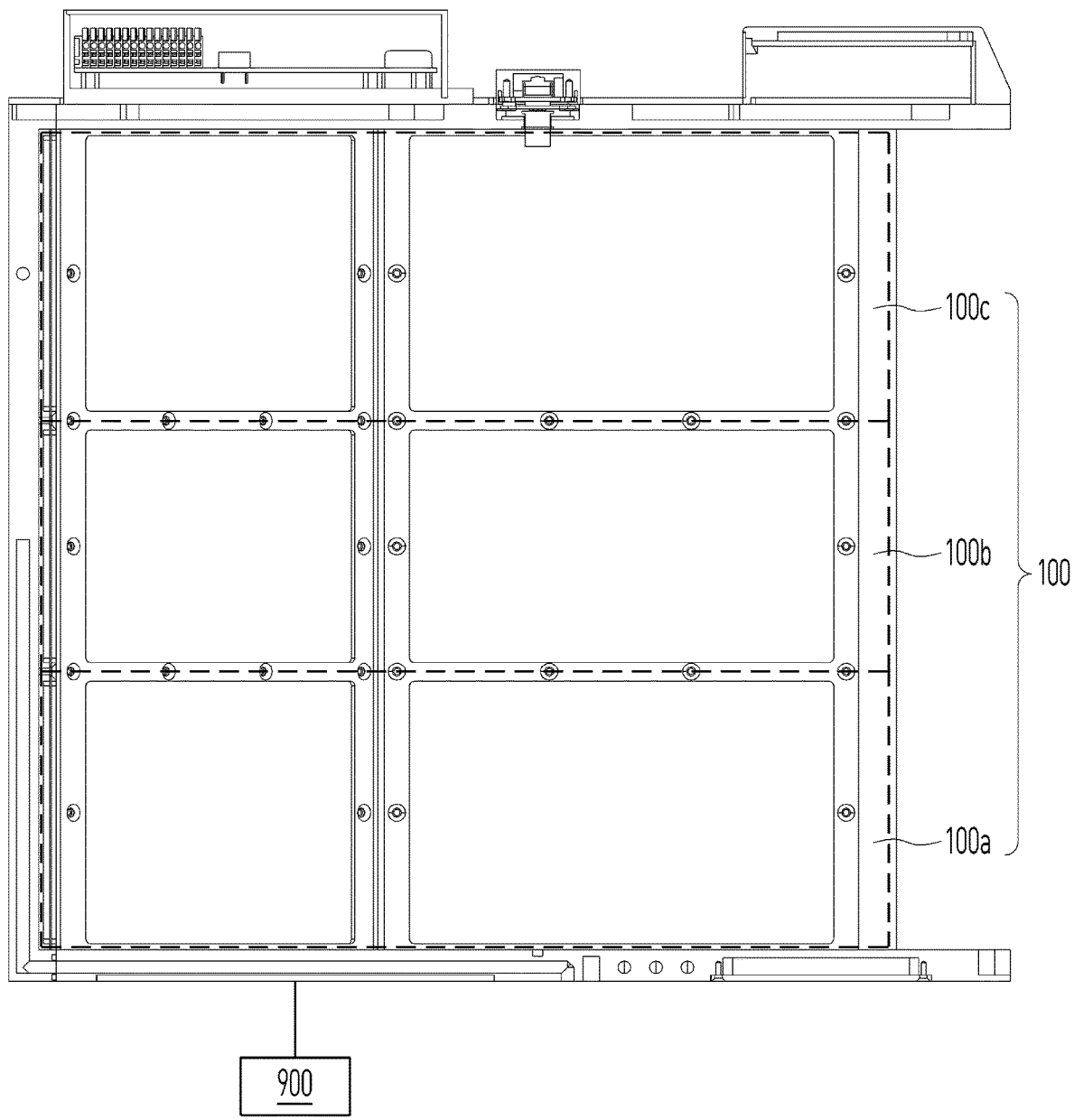
FIG. 9 is a view illustrating a state in which wafers are not stored in first to third purging regions of the wafer storage container according to the present disclosure.
Figure 10:
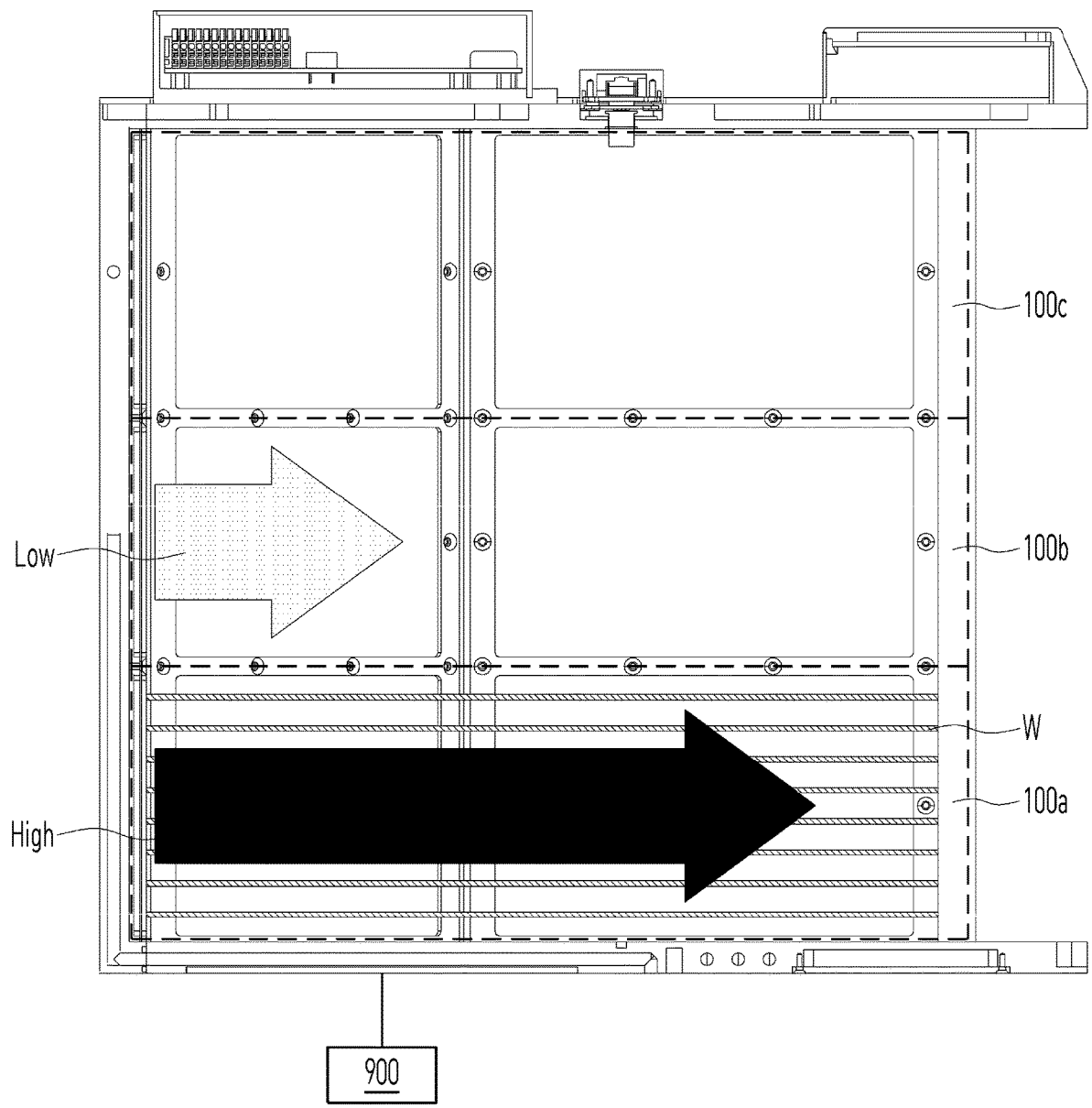
FIG. 10 is a view illustrating a difference in injection pressure of the purge gas in the first to third purging regions in a state in which wafers are stored in only the first purging region of the wafer storage container according to the present disclosure.
Figure 11:
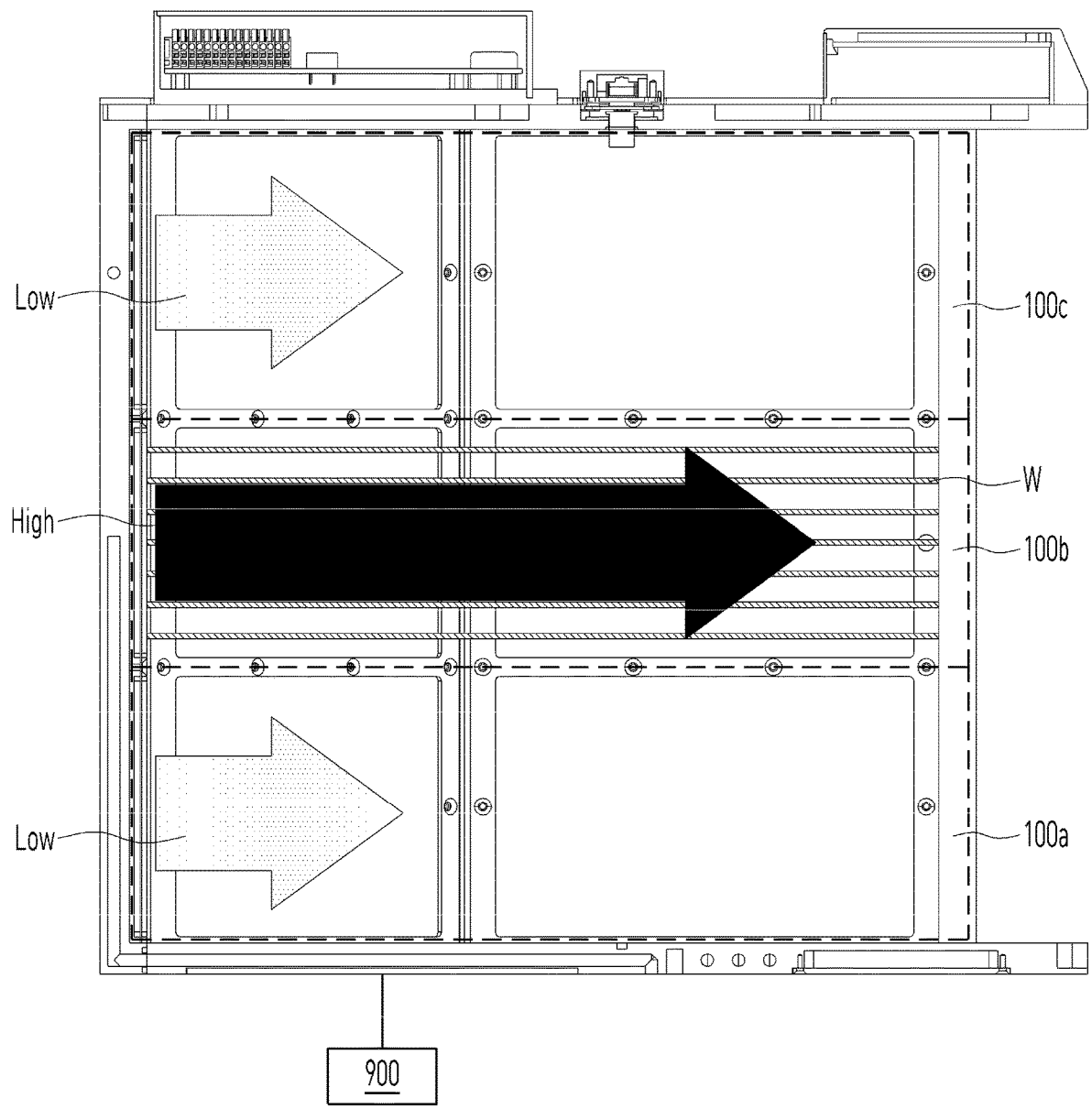
FIG. 11 is a view illustrating a difference in injection pressure of the purge gas in the first to third purging regions in a state in which wafers are stored in only the second purging region of the wafer storage container according to the present disclosure.
Figure 12:
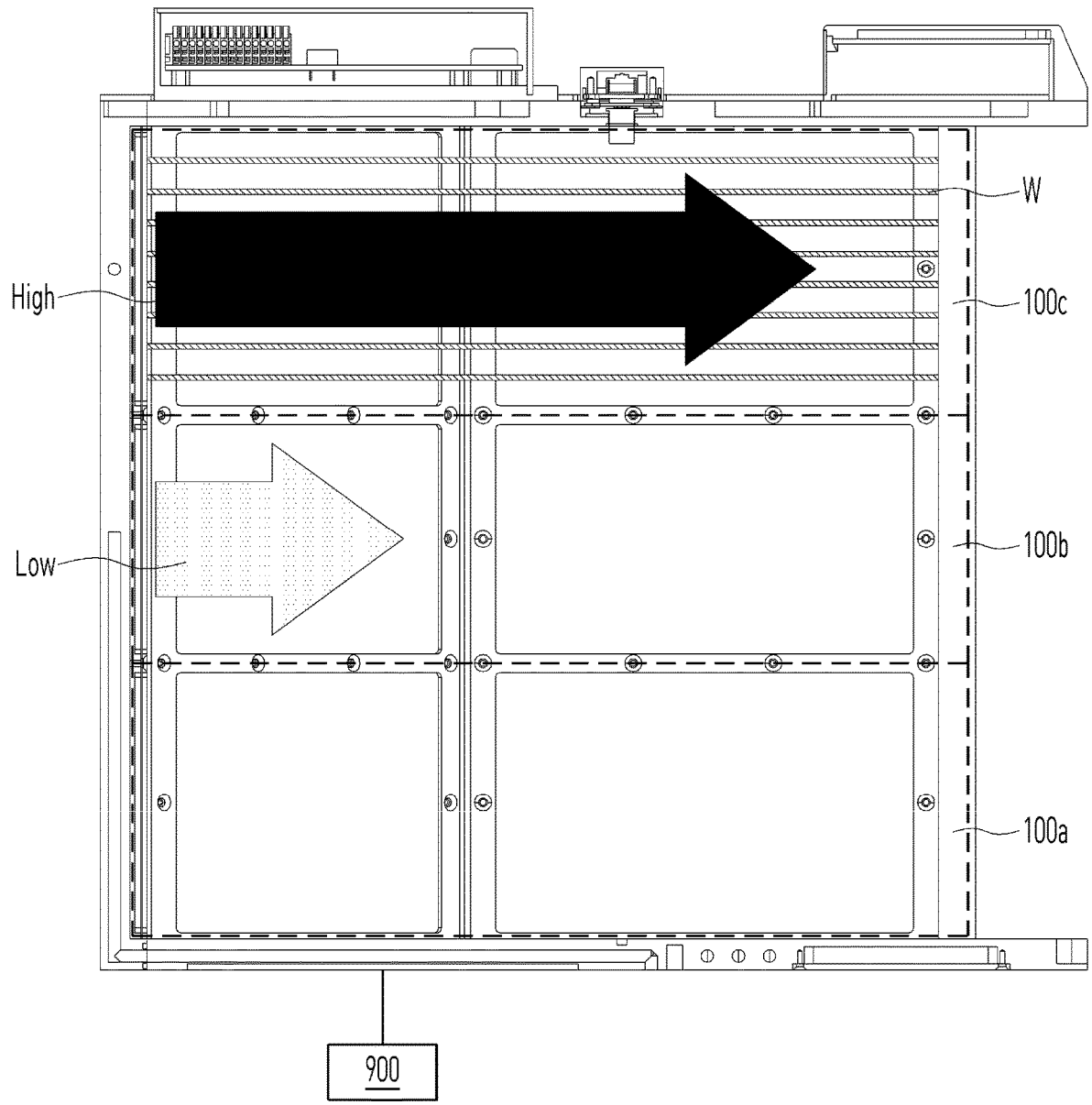
FIG. 12 is a view illustrating a difference in injection pressure of the purge gas in the first to third purging regions in a state in which wafers are stored in only the third purging region of the wafer storage container according to the present disclosure.
Figure 13:
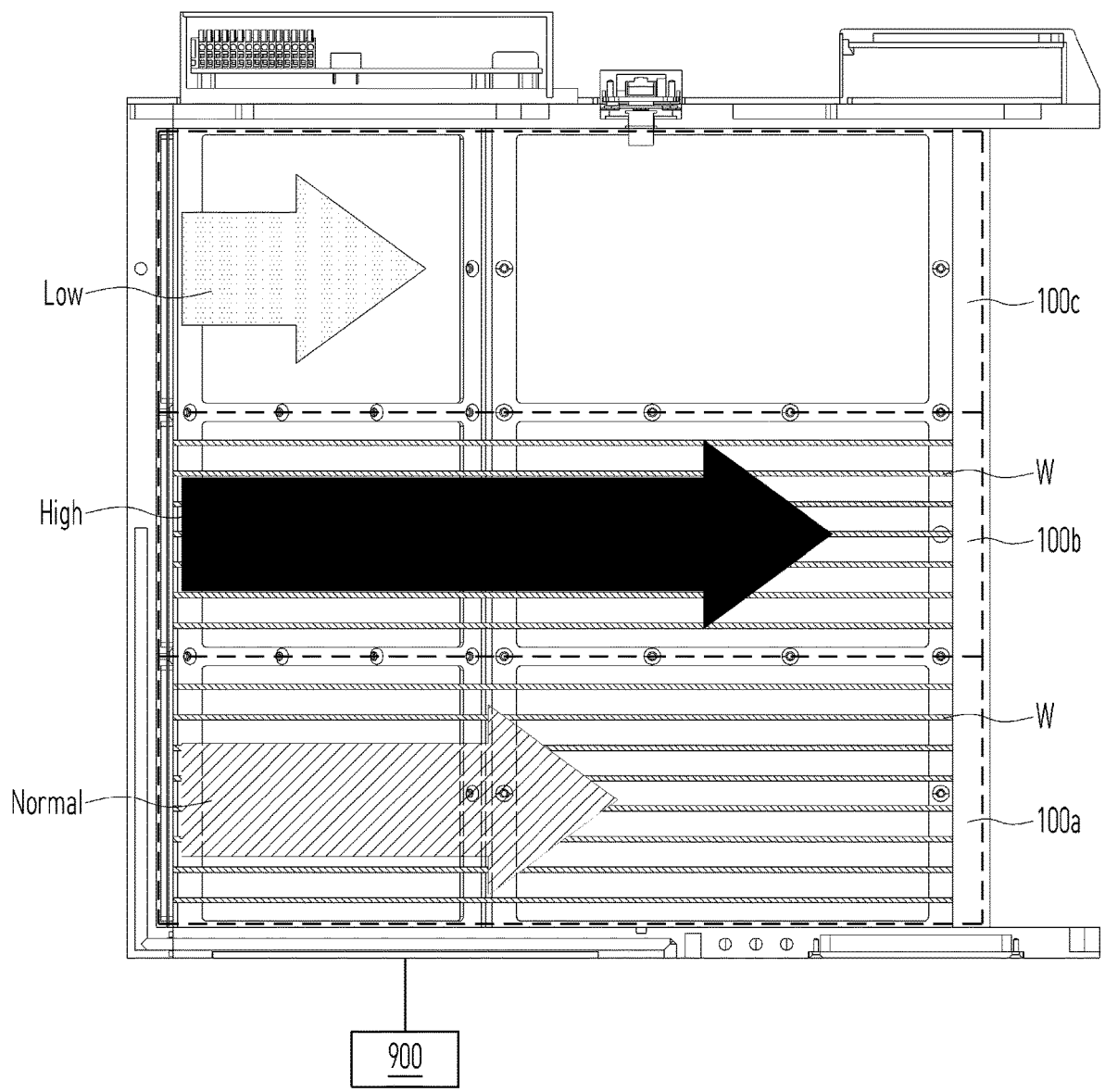
FIG. 13 is a view illustrating a difference in injection pressure of the purge gas in the first to third purging regions in a state in which wafers are stored in only the first and second purging regions of the wafer storage container according to the present disclosure.
Figure 14:
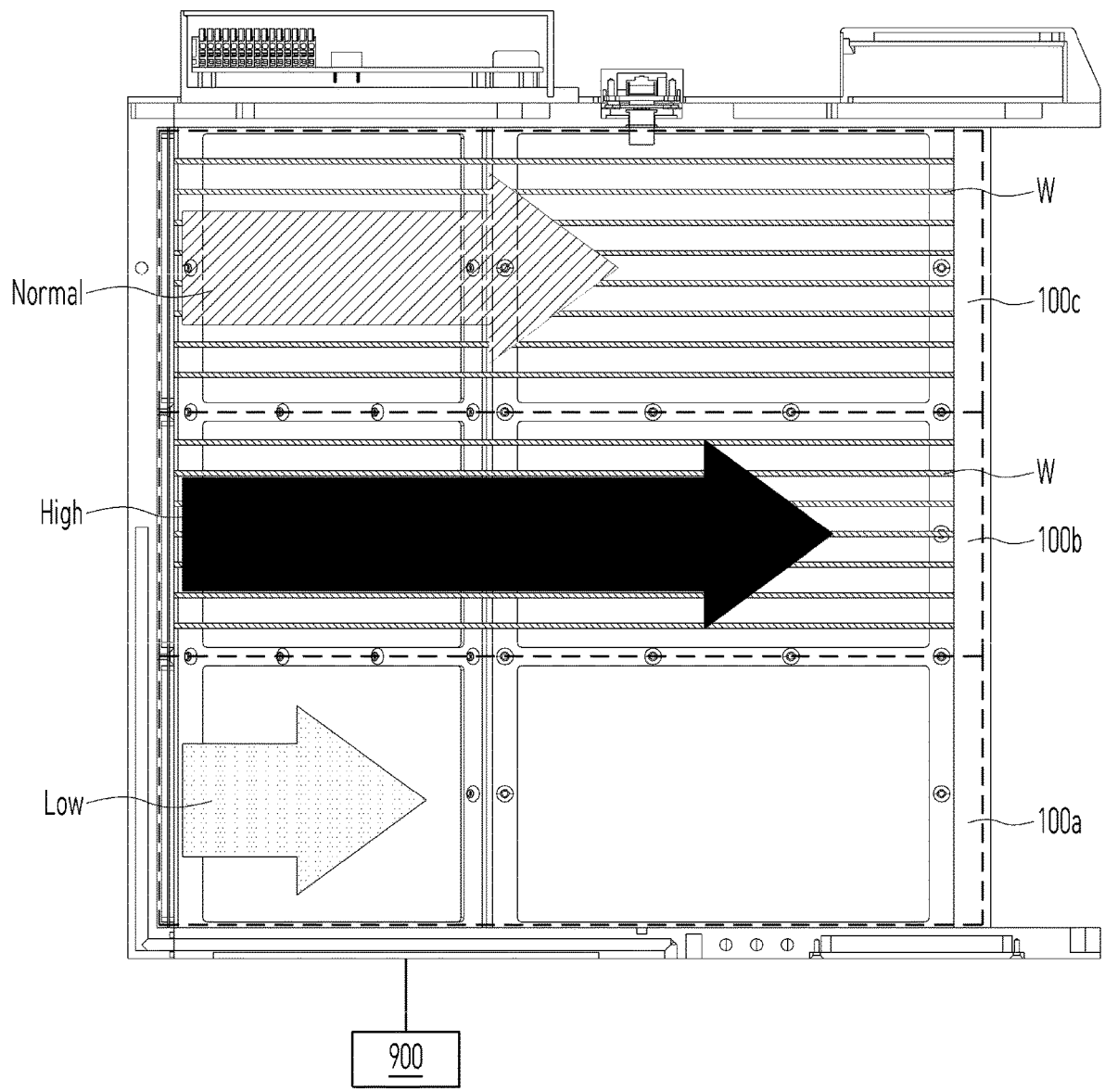
FIG. 14 is a view illustrating a difference in injection pressure of the purge gas in the first to third purging regions in a state in which wafers are stored in only the second and third purging regions of the wafer storage container according to the present disclosure.
Figure 15:
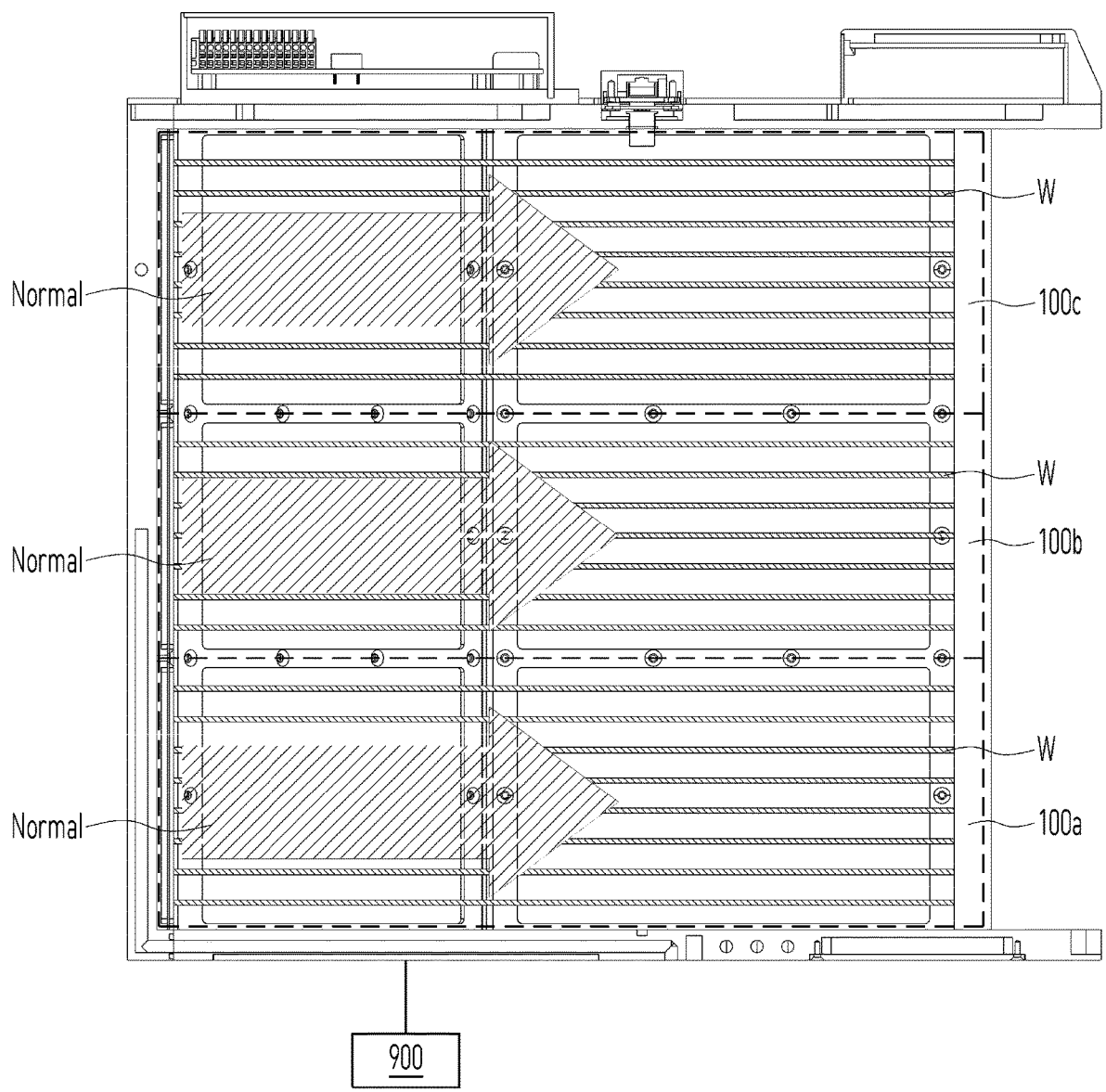
FIG. 15 is a view illustrating a state in which wafers are stored in the first to third purging regions of the wafer storage container according to the present disclosure.

FIG. 1 is a perspective view illustrating the wafer storage container according to the present disclosure; FIG. 2 is a plan sectional view illustrating the inside of a storage chamber of the wafer storage container illustrated in FIG. 1; FIG. 3 is a perspective view illustrating a state in which an upper plate of the wafer storage container illustrated in FIG. 1 is removed; FIGS. 4 and 5 are views illustrating the inside of the wafer storage container with shelves removed in the state of FIG. 3; FIGS. 6 and 7 are views illustrating a left chamber, a right chamber, a left rear chamber, a right rear chamber, and a rear chamber of the wafer storage container illustrated in FIG. 1; FIG. 8 is a view illustrating the flow of a purge gas inside the storage chamber of the wafer storage container according to the present disclosure; FIG. 9 is a view illustrating a state in which wafers are not stored in first to third purging regions of the wafer storage container according to the present disclosure; FIG. 10 is a view illustrating a difference in injection pressure of the purge gas in the first to third purging regions in a state in which wafers are stored in only the first purging region of the wafer storage container according to the present disclosure; FIG. 11 is a view illustrating a difference in injection pressure of the purge gas in the first to third purging regions in a state in which wafers are stored in only the second purging region of the wafer storage container according to the present disclosure; FIG. 12 is a view illustrating a difference in injection pressure of the purge gas in the first to third purging regions in a state in which wafers are stored in only the third purging region of the wafer storage container according to the present disclosure; FIG. 13 is a view illustrating a difference in injection pressure of the purge gas in the first to third purging regions in a state in which wafers are stored in only the first and second purging regions of the wafer storage container according to the present disclosure; FIG. 14 is a view illustrating a difference in injection pressure of the purge gas in the first to third purging regions in a state in which wafers are stored in only the second and third purging regions of the wafer storage container according to the present disclosure; and FIG. 15 is a view illustrating a state in which wafers are stored in the first to third purging regions of the wafer storage container according to the present disclosure.

As illustrated in FIGS. 1 to 15, the wafer storage container 10 according to the present disclosure includes: a storage chamber 100 storing a plurality of wafers W therein through a front opening 110; a plurality of shelves 600 provided vertically inside the storage chamber 100 to support the wafers W; a left chamber 210 forming a left surface of the storage chamber 100 and having a left hole 211 on an inner surface thereof; a right chamber 250 forming a right surface of the storage chamber 100 and having a right hole 251 on an inner surface thereof; a rear chamber 230 forming a rear surface of the storage chamber 100 and having a rear hole 231 on an inner surface thereof; a left rear chamber 220 connecting the left chamber 210 and the rear chamber 230 to each other, forming a left rear surface of the storage chamber 100, and having a left rear hole 221 on an inner surface thereof; a right rear chamber 240 connecting the right chamber 250 and the rear chamber 230 to each other, forming a right rear surface of the storage chamber 100, and having a right rear hole 241 on an inner surface thereof; a left gas supply part 300 supplying a purge gas to the left chamber 210 and the left rear chamber 220 so that the purge gas is injected into the storage chamber 100 through the left hole 211 and the left rear hole 221; a rear gas supply part 400 supplying the purge gas to the rear chamber 230 and the right rear chamber 240 so that the purge gas is injected into the storage chamber 100 through the rear hole 231 and the right rear hole 241; a right gas exhaust part 500 transmitting a suction force to the right chamber 250 so that the purge gas inside the storage chamber 100 is exhausted through the right hole 251; and a controller 900 controlling an injection pressure of the purge gas injected from each of the left chamber 210, the left rear chamber 220, the rear chamber 230, and the right rear chamber 240 and an exhaust pressure of the purge gas and fumes exhausted through the right chamber 250, according to which purging region a wafer W is stored in among first to third purging regions 100a, 100b, and 100c.

The Storage Chamber 100

Hereinbelow, the storage chamber 100 will be described.

As illustrated in FIGS. 1 to 8, the storage chamber 100 has the front opening 110 formed at the front side thereof so that the wafers W transferred from a wafer transfer chamber (not illustrated) of an EFEM (not illustrated) are stored through the front opening 110. The inside of the storage chamber 100 is divided in the vertical direction into the first purging region 100a, the second purging region 100b located above the first purging region 100a, and the third purging region 100c located above the second purging region 100b.

The storage chamber 100 functions to store the wafers W therein.

The front opening 110 is provided at the front side of the storage chamber 100 so that the front side of the storage chamber 100 is open.

The storage chamber 100 is defined as an inner space surrounded by a peripheral surface formed by the left chamber 210, the left rear chamber 220, the rear chamber 230, the right rear chamber 240, and the right chamber 250.

The wafers W are connected to the wafer transfer chamber of the EFEM through the front opening 110. A robot arm (not illustrated) is provided in the wafer transfer chamber. The robot arm transfers a wafer W that has completed a semiconductor manufacturing process in a process chamber (not illustrated) into the storage chamber 100 of the wafer storage container 10. The wafer W is moved in and out through the front opening 110. Thus, the wafer W is moved in and out of the storage chamber 100 by the robot arm and supported by a shelf 600 to be stored in the storage chamber 100.

An upper surface of the storage chamber 100 is formed by an upper plate 700, a lower surface of the storage chamber 100 is famed by a lower plate 800, and the peripheral surface of the storage chamber 100 is formed by the left chamber 210, the left rear chamber 220, the rear chamber 230, the right rear chamber 240, and the right chamber 250.

The left chamber 210 forms the left surface of the storage chamber 100, the left rear chamber 220 forms the left rear surface of the storage chamber 100, the rear chamber 230 forms the rear surface of the storage chamber 100, the right rear chamber 240 forms the right rear surface of the storage chamber 100, and the right chamber 250 forms the right surface of the storage chamber 100.

The upper, lower, and peripheral surfaces of the storage chamber 100, except for the front opening 110, are closed by the upper plate 700, the lower plate 800, the left chamber 210, the left rear chamber 220, the rear chamber 230, the right rear chamber 240, and the right chamber 250.

As illustrated in FIG. 8, the purge gas is injected from the left chamber 210, the left rear chamber 220, the rear chamber 230, and the right rear chamber 240 into the storage chamber 100. The purge gas injected into the storage chamber 100 and fumes on a wafer W are exhausted through the right chamber 250 of the storage chamber 100.

The inside of the storage chamber 100 is divided into the first purging region 100a, the second purging region 100b, and the third purging region 100c in the vertical direction.

The first purging region 100a, the second purging region 100b, and the third purging region 100c are sequentially located from the bottom to the top of the storage chamber 100. That is, the second purging region 100b is located above the first purging region 100a, and the third purging region 100c is located above the second purging region 100b.

The first to third purging regions 100a, 100b, and 100c are divided so that the purge gas is individually injected or exhausted, and are regions in which the wafers W are individually purged.

Thus, the purge gas is individually injected and exhausted in the vertical direction inside the storage chamber 100 through each of the first to third purging regions 100a, 100b, and 100c.

In addition, the wafer storage container 10 individually injects the purge gas not only in the vertical direction but also in the horizontal direction. Thus, the purge gas is individually injected in a plurality of directions in one purging region.

A Shelf 600

Hereinbelow, the shelf 600 will be described.

As illustrated in FIGS. 1 and 5, the shelf 600 for supporting a wafer W is provided inside the storage chamber 100.

A plurality of shelves 600 are provided inside the storage chamber 100 in the vertical direction according to the number of wafers W stored in the storage chamber 100.

For example, when twenty wafers W are stored in the storage chamber 100, twenty shelves 600 respectively supporting the twenty wafers W are provided.

The plurality of shelves 600 are vertically coupled by a plurality of shelf couplers 610.

The shelf couplers 610 are installed on an inner wall of the left chamber 210, an inner wall of the left rear chamber 220, an inner wall of the right rear chamber 240, and an inner wall of the right chamber 250, so that the plurality of shelves 600 are located inside the storage chamber 100. That is, the plurality of shelves 600 are coupled to each other in the vertical direction by the plurality of shelf couplers 610 and at the same time are fixedly installed on the peripheral surface of the storage chamber 100.

Each of the shelves 600 has a step 630 stepped downward so as to overlap a part of an edge region of the wafer W. The step 630 has three protruding pins 650. Thus, the wafer W is placed on the protruding pins 650 and supported by the shelf 600.

As described above, as the wafer W is placed on the protruding pins 650 and supported by the shelf 600, a contact area between the wafer W and the shelf 600 can be minimized, thereby minimizing contact damage to the wafer W.

The Lower Plate 800 and the Upper Plate 700

Hereinbelow, the lower plate 800 and the upper plate 700 will be described.

The lower plate 800 forms a lower surface of the wafer storage container 10, and functions to close a lower part of the storage chamber 100 and allow the purge gas supplied from the outside of the wafer storage container 10 to flow to the left gas supply part 300 and the rear gas supply part 400 through inner flow paths. Thus, the wafer storage container 10 individually supplies the purge gas to each of the left gas supply part 300 and the rear gas supply part 400 through the inner flow paths of the lower plate 800.

The upper plate 700 forms an upper surface of the wafer storage container 10 and functions to close the top of the storage chamber 100. It is preferable that the overall shape of the upper plate 700 is the same as that of the lower plate 800.

The Left Chamber 210

Hereinbelow, the left chamber 210 will be described.

As illustrated in FIGS. 5 and 7, the left chamber 210 forms the left surface of the storage chamber 100, and has the left hole 211 on the inner surface thereof.

The left chamber 210 includes a plurality of left chambers 210 that are individually divided in the vertical direction. As an example, the left chamber 210 includes a first left chamber 210a, a second left chamber 210b, and a third left chamber 210c.

The first left chamber 210a, the second left chamber 210b, and the third left chamber 210c have chamber spaces that are individually (or independently) divided.

The first left chamber 210a is located at a position corresponding to the first purging region 100a of the storage chamber 100. The first left chamber 210a is located at the lowermost position among the first to third left chambers 210a, 210b, and 210c. The first left chamber 210a is located below the second left chamber 210b.

The second left chamber 210b is located at a position corresponding to the second purging region 100b of the storage chamber 100. The second left chamber 210b is located between the first left chamber 210a and the third left chamber 210c. The second left chamber 210b is located above the first left chamber 210a and below the third left chamber 210c.

The third left chamber 210c is located at a position corresponding to the third purging region 100c of the storage chamber 100. The third left chamber 210c is located at the uppermost position among the first to third left chambers 210a, 210b, and 210c. The third left chamber 210c is located above the second left chamber 210b.

A plurality of left holes 211 are formed on the inner surface of the left chamber 210.

The plurality of left holes 211 function to allow the purge gas supplied into the left chamber 210 to be injected into the storage chamber 100.

The plurality of left holes 211 include a plurality of first left holes 211a provided on an inner surface of the first left chamber 210a, a plurality of second left holes 211b provided on an inner surface of the second left chamber 210b, and a plurality of third left holes 211c provided on an inner surface of the third left chamber 210c.

The plurality of first left holes 211a function to allow the purge gas supplied into the first left chamber 210a to be injected to the first purging region 100a of the storage chamber 100.

The plurality of second left holes 211b function to allow the purge gas supplied into the second left chamber 210b to be injected to the second purging region 100b of the storage chamber 100.

The plurality of third left holes 211c function to allow the purge gas supplied into the third left chamber 210c to be injected to the third purging region 100c of the storage chamber 100.

The purge gas is individually supplied into each of the first left chamber 210a, the second left chamber 210b, and the third left chamber 210c. Thus, the first left chamber 210a, the second left chamber 210b, and the third left chamber 210c individually inject the purge gas to the first purging region 100a, the second purging region 100b, and the third purging region 100c, respectively.

As described above, the first to third left chambers 210a, 210b, and 210c form the left surface of the storage chamber 100, correspond to the first to third purging regions 100a, 100b, and 100c, respectively, and have the pluralities of first to third left holes 211a, 211b, and 211c on the inner surfaces thereof, respectively. The first to third left chambers 210a, 210b, and 210c individually receive the purge gas and individually inject the purge gas to the first to third purging regions 100a, 100b, and 100c, respectively, through the pluralities of first to third left holes 211a, 211b, and 211c, respectively.

The Left Rear Chamber 220

Hereinbelow, the left rear chamber 220 will be described.

As illustrated in FIGS. 5 and 7, the left rear chamber 220 forms the left rear surface of the storage chamber 100, and has the left rear hole 221 on the inner surface thereof.

The left rear chamber 220 has a shape inclined right toward the rear side of the storage chamber 100.

The left rear chamber 220 includes a plurality of left rear chambers 220 that are individually divided in the vertical direction. As an example, the left rear chamber 220 includes a first left rear chamber 220a, a second left rear chamber 220b, and a third left rear chamber 220c.

The first left rear chamber 220a, the second left rear chamber 220b, and the third left rear chamber 220c have chamber spaces that are individually (or independently) divided.

The first left rear chamber 220a is located at a position corresponding to the first purging region 100a of the storage chamber 100. The first left rear chamber 220a is located at the lowest position among the first to third left rear chambers 220a, 220b, and 220c. The first left rear chamber 220a is located below the second left rear chamber 220b.

The second left rear chamber 220b is located at a position corresponding to the second purging region 100b of the storage chamber 100. The second left rear chamber 220b is located between the first left rear chamber 220a and the third left rear chamber 220c. The second left rear chamber 220b is located above the first left rear chamber 220a and below the third left rear chamber 220c.

The third left rear chamber 220c is located at a position corresponding to the third purging region 100c of the storage chamber 100. The third left rear chamber 220c is located at the uppermost position among the first to third left rear chambers 220a, 220b, and 220c. The third left rear chamber 220c is located above the second left rear chamber 220b.

A plurality of left rear holes 221 are formed on the inner surface of the left rear chamber 220.

The plurality of left rear holes 221 function to allow the purge gas supplied into the left rear chamber 220 to be injected into the storage chamber 100.

The plurality of left rear holes 221 include a plurality of first left rear holes 221a provided on an inner surface of the first left rear chamber 220a, a plurality of second left rear holes 221b provided on an inner surface of the second left rear chamber 220b, and a plurality of third left rear holes 221c provided on an inner surface of the third left rear chamber 220c.

The plurality of first left rear holes 221a function to allow the purge gas supplied into the first left rear chamber 220a to be injected to the first purging region 100a of the storage chamber 100.

The plurality of second left rear holes 221b function to allow the purge gas supplied into the second left rear chamber 220b to be injected to the second purging region 100b of the storage chamber 100.

The plurality of third left rear holes 221c function to allow the purge gas supplied into the third left rear chamber 220c to be injected to the third purging region 100c of the storage chamber 100.

The purge gas is individually supplied into each of the first left rear chamber 220a, the second left rear chamber 220b, and the third left rear chamber 220c. Thus, the first left rear chamber 220a, the second left rear chamber 220b, and the third left rear chamber 220c individually inject the purge gas to the first purging region 100a, the second purging region 100b, and the third purging region 100c, respectively.

As described above, the first to third left rear chambers 220a, 220b, and 220c form the left rear surface of the storage chamber 100, correspond to the first to third purging regions 100a, 100b, and 100c, respectively, and have the pluralities of first to third left rear holes 221a, 221b, and 221c on the inner surfaces thereof, respectively. The first to third left rear chambers 220a, 220b, and 220c individually receive the purge gas and individually inject the purge gas to the first to third purging regions 100a, 100b, and 100c, respectively, through the pluralities of first to third left rear holes 221a, 221b, and 221c, respectively.

The Left Gas Supply Part 300

Hereinbelow, the left gas supply part 300 will be described.

The left gas supply part 300 functions to supply the purge gas to the left chamber 210 and the left rear chamber 220 so that the purge gas is injected into the storage chamber 100 through the left holes 211 and the left rear holes 221.

To facilitate supply of the purge gas to the left chamber 210 and the left rear chamber 220, the third left body 330 is disposed on the left side of the left chamber 210 and the left rear side of the left rear chamber 220.

The left gas supply part 300 individually supplies the purge gas to each of the first left chamber 210a, the second left chamber 210b, the third left chamber 210c, the first left rear chamber 220a, the second left rear chamber 220b, the third left rear chamber 220c so that the purge gas is individually injected into the storage chamber 100 from each of the first left chamber 210a, the second left chamber 210b, the third left chamber 210c, the first left rear chamber 220a, the second left rear chamber 220b, and the third left rear chamber 220c.

The left gas supply part 300 has the same number of inner flow paths as the number of the first to third left chambers 210a, 210b, and 210c and the first to third left rear chambers 220a, 220b, and 220c.

Thus, the inner flow paths of the left gas supply part 300 individually receive the purge gas through the inner flow paths of the lower plate 800 and individually supply the purge gas to the first to third left chambers 210a, 210b, and 210c and the first to third left rear chambers 220a, 220b, and 220c, respectively.

For example, the lower plate 800 has six inner flow paths connected to six external supply lines, respectively, and the left gas supply part 300 also has six inner flow paths. The purge gas is supplied to the first to third left chambers 210a, 210b, and 210c and the first to third left rear chambers 220a, 220b, and 220c through the six inner flow paths of the left gas supply part 300, respectively, thereby achieving individual supply and injection of the purge gas.

The Rear Chamber 230

Hereinbelow, the rear chamber 230 will be described.

As illustrated in FIGS. 4 to 7, the rear chamber 230 forms the rear surface of the storage chamber 100 and has the rear hole 231 on the inner surface thereof.

The rear chamber 230 includes a plurality of rear chambers 230 that are individually divided in the vertical direction. As an example, the rear chamber 230 includes a first rear chamber 230a, a second rear chamber 230b, and a third rear chamber 230c.

The first rear chamber 230a, the second rear chamber 230b, and the third rear chamber 230c have chamber spaces that are individually (or independently) divided.

The first rear chamber 230a is located at a position corresponding to the first purging region 100a of the storage chamber 100. The first rear chamber 230a is located at the lowermost position among the first to third rear chambers 230a, 230b, and 230c. The first rear chamber 230a is located below the second rear chamber 230b.

The second rear chamber 230b is located at a position corresponding to the second purging region 100b of the storage chamber 100. The second rear chamber 230b is located between the first rear chamber 230a and the third rear chamber 230c. The second rear chamber 230b is located above the first rear chamber 230a and below the third rear chamber 230c.

The third rear chamber 230c is located at a position corresponding to the third purging region 100c of the storage chamber 100. The third rear chamber 230c is located at the uppermost position among the first to third rear chambers 230a, 230b, and 230c. The third rear chamber 230c is located above the second rear chamber 230b.

A plurality of rear holes 231 are formed on the inner surface of the rear chamber 230.

The plurality of rear holes 231 function to allow the purge gas supplied into the rear chamber 230 to be injected into the storage chamber 100.

The plurality of rear holes 231 include a plurality of first rear holes 231a provided on an inner surface of the first rear chamber 230a, a plurality of second rear holes 231b provided on an inner surface of the second rear chamber 230b, and a plurality of third rear holes 231c provided on an inner surface of the third rear chamber 230c.

The plurality of first rear holes 231a function to allow the purge gas supplied into the first rear chamber 230a to be injected to the first purging region 100a of the storage chamber 100.

The plurality of second rear holes 231b function to allow the purge gas supplied into the second rear chamber 230b to be injected to the second purging region 100b of the storage chamber 100.

The plurality of third rear holes 231c function to allow the purge gas supplied into the third rear chamber 230c to be injected to the third purging region 100c of the storage chamber 100.

The purge gas is individually supplied into each of the first rear chamber 230a, the second rear chamber 230b, and the third rear chamber 230c. Thus, the first rear chamber 230a, the second rear chamber 230b, and the third rear chamber 230c individually inject the purge gas to the first purging region 100a, the second purging region 100b, and the third purging region 100c, respectively.

The Right Rear Chamber 240

Hereinbelow, the right rear chamber 240 will be described.

As illustrated in FIGS. 4 and 6, the right rear chamber 240 forms the right rear surface of the storage chamber 100 and has the right rear hole 241 on the inner surface thereof.

The right rear chamber 240 has a shape inclined left toward the rear side of the storage chamber 100.

The right rear chamber 240 includes a plurality of right rear chambers 240 that are individually divided in the vertical direction. As an example, the right rear chamber 240 includes a first right rear chamber 240a, a second right rear chamber 240b, and a third right rear chamber 240c.

The first right rear chamber 240a, the second right rear chamber 240b, and the third right rear chamber 240c have chamber spaces that are individually (or independently) divided.

The first right rear chamber 240a is located at a position corresponding to the first purging region 100a of the storage chamber 100. The first right rear chamber 240a is located at the lowermost position among the first to third right rear chambers 240a, 240b, and 240c. The first right rear chamber 240a is located below the second right rear chamber 240b.

The second right rear chamber 240b is located at a position corresponding to the second purging region 100b of the storage chamber 100. The second right rear chamber 240b is located between the first right rear chamber 240a and the third right rear chamber 240c. The second right rear chamber 240b is located above the first right rear chamber 240a and below the third right rear chamber 240c.

The third right rear chamber 240c is located at a position corresponding to the third purging region 100c of the storage chamber 100. The third right rear chamber 240c is located at the uppermost position among the first to third right rear chambers 240a, 240b, and 240c. The third right rear chamber 240c is located above the second right rear chamber 240b.

A plurality of right rear holes 241 are formed on the inner surface of the right rear chamber 240.

The plurality of right rear holes 241 function to allow the purge gas supplied into the right rear chamber 240 to be injected into the storage chamber 100.

The plurality of right rear holes 241 include a plurality of first right rear holes 241a provided on an inner surface of the first right rear chamber 240a, a plurality of second right rear holes 241b provided on an inner surface of the second right rear chamber 240b, and a plurality of third right rear holes 241c provided on an inner surface of the third right rear chamber 240c.

The plurality of first right rear holes 241a function to allow the purge gas supplied into the first right rear chamber 240a to be injected to the first purging region 100a of the storage chamber 100.

The plurality of second right rear holes 241b function to allow the purge gas supplied into the second right rear chamber 240b to be injected to the second purging region 100b of the storage chamber 100.

The plurality of third right rear holes 241c function to allow the purge gas supplied into the third right rear chamber 240c to be injected to the third purging region 100c of the storage chamber 100.

The purge gas is individually supplied into each of the first right rear chamber 240a, the second right rear chamber 240b, and the third right rear chamber 240c. Thus, the first right rear chamber 240a, the second right rear chamber 240b, and the third right rear chamber 240c individually inject the purge gas to the first purging region 100a, the second purging region 100b, and the third purging region 100c, respectively.

The Rear Gas Supply Part 400

Hereinbelow, the rear gas supply part 400 will be described.

The rear gas supply part 400 functions to inject the purge gas to the rear chamber 230 and the right rear chamber 240 so that the purge gas is injected into the storage chamber 100 through the rear holes 231 and the right rear holes 241.

To facilitate supply of the purge gas to the right chamber 230 and the right rear chamber 240, the rear gas supply part 400 is disposed on the rear side of the rear chamber 230 and the right rear side of the right rear chamber 240.

The rear gas supply part 400 individually supplies the purge gas to each of the first rear chamber 230a, the second rear chamber 230b, the third rear chamber 230c, the first right rear chamber 240a, the second right rear chamber 240b, and the third right rear chamber 240c so that the purge gas is individually injected into the storage chamber 100 from each of the first rear chamber 230a, the second rear chamber 230b, the third rear chamber 230c, the first right rear chamber 240a, the second right rear chamber 240b, and the third right rear chamber 240.

The rear gas supply part 400 has the same number of inner flow paths as the number of the first to third rear chambers 230a, 230b, and 230c and the first to third left rear chambers 240a, 240b, and 240c.

Thus, the inner flow paths of the rear gas supply part 400 individually receive the purge gas through the inner flow paths of the lower plate 800 and individually supply the purge gas to the first to third rear chambers 230a, 230b, and 230c and the first to third left rear chambers 240a, 240b, and 240c, respectively.

For example, the lower plate 800 has six inner flow paths connected to six external supply lines, respectively, and the rear gas supply part 400 also has six inner flow paths. The purge gas is supplied to the first to third rear chambers 230a, 230b, and 230c and the first to third left rear chambers 240a, 240b, and 240c through the six inner flow paths of the rear gas supply part 400, respectively, thereby achieving individual supply and injection of the purge gas.

The Right Chamber 250

Hereinbelow, the right chamber 250 will be described.

As illustrated in FIGS. 4 and 6, the right chamber 250 forms the right surface of the storage chamber 100 and has the right hole 251 on the inner surface thereof.

The right chamber 250 includes a plurality of right chambers 250 that are individually divided in the vertical direction. As an example, the right chamber 250 includes a first right chamber 250a, a second right chamber 250b, and a third right chamber 250c.

The first right chamber 250a is located at a position corresponding to the first purging region 100a of the storage chamber 100. The first right chamber 250a is located at the lowermost position among the first to third right chambers 250a, 250b, and 250c. The first right chamber 250a is located below the second right chamber 250b.

The second right chamber 250b is located at a position corresponding to the second purging region 100b of the storage chamber 100. The second right chamber 250b is located between the first right chamber 250a and the third right chamber 250c. The second right chamber 250b is located above the first right chamber 250a and below the third right chamber 250c.

The third right chamber 250c is located at a position corresponding to the third purging region 100c of the storage chamber 100. The third right chamber 250c is located at the uppermost position among the first to third right chambers 250a, 250b, and 250c. The third right chamber 250c is located above the second right chamber 250b.

A plurality of right holes 251 are formed on the inner surface of the right chamber 250.

The plurality of right holes 251 function to allow the purge gas and fumes inside the storage chamber 100 to be exhausted into the right chamber 250.

The plurality of right holes 251 include a plurality of first right holes 251a provided on an inner surface of the first right chamber 250a, a plurality of second right holes 251b provided on an inner surface of the second right chamber 250b, and a plurality of third right holes 251c provided on an inner surface of the third right chamber 250c.

The plurality of first right holes 251a function to allow the purge gas injected to the first purging region 100a of the storage chamber 100 and the fumes on the wafer W to be exhausted into the first right chamber 250a.

The plurality of second right holes 251b function to allow the purge gas injected to the second purging region 100b of the storage chamber 100 and the fumes on the wafer W to be exhausted into the second right chamber 250b.

The plurality of third right holes 251c function to allow the purge gas injected to the third purging region 100c of the storage chamber 100 and the fumes on the wafer W to be exhausted into the third right chamber 250c.

The purge gas and fumes are individually exhausted to each of the first right chamber 250a, the second right chamber 250b, and the third right chamber 250c. Thus, the first right chamber 250a, the second right chamber 250b, and the third right chamber 250c individually exhaust the purge gas and fumes from the first purging region 100a, the second purging region 100b, and the third purging region 100c, respectively.

The Right Gas Exhaust Part 500

Hereinbelow, the right gas exhaust part 500 will be described.

The right gas exhaust part 500 functions to transmit a suction force to the right chamber 250 so that the purge gas inside the storage chamber 100 and the fumes on the wafer W are exhausted through the right holes 251.

The right gas exhaust part 500 includes a body 510, first to third valves 521a, 521b, and 521c, and a hopper 530.

The body 510 includes: a first right chamber communication space 511a located at a height corresponding to the first right chamber 250a and communicating with the first right chamber 250a; a second right chamber communication space 511b located at a height corresponding to the second right chamber 250b and communicating with the second right chamber 250b; and a third right chamber communication space 511c located at a height corresponding to the third right chamber 250c and communicating with the third right chamber 250c.

The first right chamber communication space 511a is located below the second right chamber communication space 511b.

The second right chamber communication space 511b is located above the first right chamber communication space 511a and below the third right chamber communication space 511c.

The third right chamber communication space 511c is located above the second right chamber communication space 511b.

To facilitate exhaust of the purge gas and fumes from the right chamber 250, the body 510 is disposed on the right side of the right chamber 250. Thus, the first right chamber communication space 511a is disposed on the right side of the first right chamber 250a so that the first right chamber communication space 511a and the first right chamber 250a communicate with each other. The second right chamber communication space 511b is disposed on the right side of the second right chamber 250b so that the second right chamber communication space 511b and the second right chamber 250b communicate with each other. The third right chamber communication space 511c is disposed on the right side of the third right chamber 250c so that the third right chamber communication space 511c and the third right chamber 250c communicate with each other.

The first valve 521a functions to open or block communication between the hopper 530 and the first right chamber 250a.

The second valve 521b functions to open or block communication between the hopper 530 and the second right chamber 250b.

The third valve 521c functions to open or block communication between the hopper 530 and the third right chamber 250c.

The first to third valves 521a, 521b, and 521c are disposed on the right rear side of the right rear chamber 240.

The first valve 521a is located at a height corresponding to the first right chamber 250a and the first right chamber communication space 511a.

The first valve 521a is located below the second valve 521b.

When the first valve 521a is opened, the hopper 530 and the first right chamber communication space 511a communicate with each other, so that a suction force of an external exhaust line is transmitted to the first right chamber 250a. Thus, the purge gas and fumes are exhausted through the first right holes 251a of the first right chamber 250a.

When the first valve 521a is closed, communication between the hopper 530 and the first right chamber communication space 511a is blocked, so that the suction force of the external exhaust line is not transmitted to the first right chamber 250a. Thus, the purge gas and fumes are not exhausted through the first right holes 251a of the first right chamber 250a.

As described above, the first valve 521a opens or blocks communication between the hopper 530 and the first right chamber 250a.

The second valve 521b is located at a height corresponding to the second right chamber 250b and the second right chamber communication space 511b.

The second valve 521b is located above the first valve 521a and below the third valve 521c.

When the second valve 521b is opened, the hopper 530 and the second right chamber communication space 511b communicate with each other, so that the suction force of the external exhaust line is transmitted to the second right chamber 250b. Thus, the purge gas and fumes are exhausted through the second right holes 251b of the second right chamber 250b.

When the second valve 521b is closed, communication between the hopper 530 and the second right chamber communication space 511b is blocked, so that the suction force of the external exhaust line is not transmitted to the second right chamber 250b. Thus, the purge gas and fumes are not exhausted through the second right holes 251b of the second right chamber 250b.

As described above, the second valve 521b opens or blocks communication between the hopper 530 and the second right chamber 250b.

The third valve 521c is located at a height corresponding to the third right chamber 250c and the third right chamber communication space 511c.

The third valve 521c is located above the second valve 521b.

When the third valve 521c is opened, the hopper 530 and the third right chamber communication space 511c communicate with each other, so that the suction force of the external exhaust line is transmitted to the third right chamber 250c. Thus, the purge gas and fumes are exhausted through the third right holes 251c of the third right chamber 250c.

When the third valve 521c is closed, communication between the hopper 530 and the third right chamber communication space 511c is blocked, so that the suction force of the external exhaust line is not transmitted to the third right chamber 250c. Thus, the purge gas and fumes are not exhausted through the third right holes 251c of the third right chamber 250c.

As described above, the third valve 521c opens or blocks communication between the hopper 530 and the third right chamber 250c.

The hopper 530 is disposed on the right rear side of the right rear chamber 240. The hopper 530 is disposed on the rear right side of the second right chamber 250b.

The hopper 530 communicates with the first right chamber communication space 511a and the first right chamber 250a by the first valve 521a, communicates with the second right chamber communication space 511b and the second right chamber 250b by the second valve 521b, and communicates with the third right chamber communication space 511c and the third right chamber 250c by the third valve 521c.

The hopper 530 communicates with the external exhaust line through an open lower surface thereof and functions to transfer the suction force of the external exhaust line to the right gas exhaust part 500.

The hopper 530 has a space formed therein so that the purge gas and fumes are exhausted to the external exhaust line through the space.

The Controller 900

Hereinbelow, the controller 900 will be described.

The controller 900 functions to control an injection pressure of the purge gas injected from each of the first to third left chambers 210a, 210b, and 210c, an injection pressure of the purge gas injected from each of the first to third left rear chambers 220a, 220b, and 220c, an injection pressure of the purge gas injected from each of the first to third rear chambers 230a, 230b, and 230c, and an injection pressure of the purge gas injected from each of the first to third right rear chambers 240a, 240b, and 240c, according to which purging region a wafer W is stored in among the first to third purging regions 100a, 100b, and 100c of the storage chamber 100.

In addition, the controller 900 functions to control an exhaust pressure of the purge gas and fumes exhausted through each of the first to third right chambers 250, according to which purging region the wafer W is stored in among the first to third purging regions 100a, 100b, and 100c of the storage chamber 100.

As an example, when the purge gas is injected, the injection pressure of the purge gas is selectively adjusted to "High", "Normal", or "Low" by the controller 900. In this case, the magnitude of the injection pressure satisfies the relationship of "High>Normal>Low".

The controller 900 controls the magnitude of the injection pressure of the purge gas by controlling a supply pressure of an external supply line or by controlling an open ratio of a valve provided in an inner flow path.

In the external supply line, a supply pressure of the purge gas or a supply flow rate of the purge gas is controlled by a flow control device (not illustrated) connected to the wafer storage container 10.

For example, a main supply line pre-installed in a factory where the wafer storage container 10 and the EFEM are installed and the wafers W are manufactured is connected to the flow control device.

The flow control device controls the main supply line by dividing it into six external supply lines. That is, one main supply line is divided into six external supply lines by the flow control device and connected to the wafer storage container 10.

As supply pressures or supply flow rates of the six external supply lines are controlled by the flow control device, injection pressures and injection flow rates of the purge gas supplied and injected by the left gas supply part 300 and the rear gas supply part 400 are controlled. The flow control device may be controlled by the controller 900.

In addition, when the purge gas is exhausted, the exhaust pressure of the purge gas is selectively adjusted to "High", "Normal", or "Low" by the controller 900. In this case, the magnitude of the exhaust pressure satisfies the relationship of "High>Normal>Low".

The controller 900 controls the exhaust pressure of the purge gas by controlling a suction force of the external exhaust line or by controlling opening ratios of the first to third valves 521a, 521b, and 521c.

The Flow of the Purge Gas and Fumes in the Wafer Storage Container 10 According to the Present Disclosure Hereinbelow, the flow of the purge gas and fumes in the wafer storage container 10 according to the present disclosure will be described.

The purge gas is supplied from the outside of the wafer storage container 10 to the inside of the wafer storage container 10 through an external supply line.

The external supply line is provided in plurality. The plurality of external supply lines communicate with the inner flow paths of the left gas supply part 300 and the inner flow paths of the rear gas supply part 400 through the inner flow paths of the lower plate 800.

The purge gas flowing into each of the inner flow paths of the left gas supply part 300 flows into each of the first to third left chambers 210a, 210b, and 210c and the first to third left rear chambers 220a, 220b, and 220c.

The purge gas flowing into the first left chamber 210a is injected to the first purging region 100a in the storage chamber 100 through the plurality of first left holes 211a. In this case, the purge gas injected through the plurality of first left holes 211a is injected to the left side of the first purging region 100a of the storage chamber 100.

The purge gas flowing into the first left rear chamber 220a is injected to the first purging region 100a in the storage chamber 100 through the plurality of first left rear holes 221a. In this case, the purge gas injected through the plurality of first left rear holes 221a is injected to the left rear side of the first purging region 100a of the storage chamber 100.

The purge gas flowing into the second left chamber 210b is injected to the second purging region 100b in the storage chamber 100 through the plurality of second left holes 211b. In this case, the purge gas injected through the plurality of second left holes 211b is injected to the left side of the second purging region 100b of the storage chamber 100.

The purge gas flowing into the second left rear chamber 220b is injected to the second purging region 100b in the storage chamber 100 through the plurality of second left rear holes 221b. In this case, the purge gas injected through the plurality of second left rear holes 221b is injected to the left rear side of the second purging region 100b of the storage chamber 100.

The purge gas flowing into the third left chamber 210c is injected to the third purging region 100c in the storage chamber 100 through the plurality of third left holes 211c. In this case, the purge gas injected through the plurality of third left holes 211c is injected from the left side of the third purging region 100c of the storage chamber 100.

The purge gas flowing into the third left rear chamber 220c is injected to the third purging region 100c in the storage chamber 100 through the plurality of third left rear holes 221c. In this case, the purge gas injected through the plurality of third left rear holes 221c is injected to the left rear side of the third purging region 100c of the storage chamber 100.

The purge gas flowing into each of the inner flow paths of the rear gas supply part 400 flows into each of the first to third rear chambers 230a, 230b, and 230c and the first to third right rear chambers 240a, 240b, and 240c.

The purge gas flowing into the first rear chamber 230a is injected to the first purging region 100a in the storage chamber 100 through the plurality of first rear holes 231a. In this case, the purge gas injected through the plurality of first rear holes 231a is injected to the rear side of the first purging region 100a of the storage chamber 100.

The purge gas flowing into the first right rear chamber 240a is injected to the first purging region 100a in the storage chamber 100 through the plurality of first right rear holes 241a. In this case, the purge gas injected through the plurality of first right rear holes 241a is injected to the right rear side of the first purging region 100a of the storage chamber 100.

The purge gas flowing into the second rear chamber 230b is injected to the second purging region 100b in the storage chamber 100 through the plurality of second rear holes 231b. In this case, the purge gas injected through the plurality of second rear holes 231b is injected to the rear side of the second purging region 100b of the storage chamber 100.

The purge gas flowing into the second right rear chamber 240b is injected to the second purging region 100b in the storage chamber 100 through the plurality of second right rear holes 241b. In this case, the purge gas injected through the plurality of second right rear holes 241b is injected to the right rear side of the second purging region 100b of the storage chamber 100.

The purge gas flowing into the third rear chamber 230c is injected to the third purging region 100c in the storage chamber 100 through the plurality of third rear holes 231c. In this case, the purge gas injected through the plurality of third rear holes 231c is injected to the rear side of the third purging region 100c of the storage chamber 100.

The purge gas flowing into the third right rear chamber 240c is injected to the third purging region 100c in the storage chamber 100 through the plurality of third right rear holes 241c. In this case, the purge gas injected through the plurality of third right rear holes 241c is injected to the right rear side of the third purging region 100c of the storage chamber 100.

Hereinbelow, exhaust of the purge gas and fumes by the right gas exhaust part 500 and the right chamber 250 will be described.

While the hopper 530 of the right gas exhaust part 500 has one space, the right chamber 250 is divided into the first right chamber 250a, the second right chamber 250b, and the third right chamber 250c that have chamber spaces divided individually (or independently). The first valve 521a, the second valve 521b, and the third valve 521c open or block communication between the first right chamber 250a, the second right chamber 250b, and the third right chamber 250c and the hopper 530, respectively. Thus, the purge gas and fumes are exhausted by the first right chamber 250a, the second right chamber 250b, and the third right chamber 250c individually (or independently).

Exhaust of the purge gas and the fumes on a wafer W in the first purging region 100a of the storage chamber 100 is performed by the first right chamber 250a.

When the first valve 521a is opened, the suction force of the external exhaust line is transmitted from the hopper 530 to the first right chamber 250a. Therefore, the purge gas and the fumes on the wafer W in the first purging region 100a of the storage chamber 100 are exhausted through the plurality of first right holes 251a. The purge gas and fumes exhausted through the plurality of first right holes 251a flow into the first right chamber 250a, then flow to the external exhaust line through the hopper 530, and finally are exhausted to the outside of the wafer storage container 10.

When the second valve 521b is opened, the suction force of the external exhaust line is transmitted from the hopper 530 to the second right chamber 250b. Thus, the purge gas and the fumes on a wafer W in the second purging region 100b of the storage chamber 100 are exhausted through the plurality of second right holes 251b. The purge gas and fumes exhausted through the plurality of second right holes 251b flow into the second right chamber 250b, then flow to the external exhaust line through the hopper 530, and finally are exhausted to the outside of the wafer storage container 10.

When the third valve 521c is opened, the suction force of the external exhaust line is transferred from the hopper 530 to the third right chamber 250c. Thus, the purge gas and the fumes on a wafer W in the third purging region 100c of the storage chamber 100 are exhausted through the plurality of third right holes 251c. The purge gas and fumes exhausted through the plurality of third right holes 251c flow into the third right chamber 250c, then flow to the external exhaust line through the hopper 530, and finally are exhausted to the outside of the wafer storage container 10.

The hopper 530 of the right gas exhaust part 500 is located behind the first right chamber communication space 511a, the second right chamber communication space 511b, and the third right chamber communication space 511c. In other words, the hopper 530 is located behind the first right chamber 250a, the second right chamber 250b, and the third right chamber 250c.

As illustrated in FIG. 6, a right cover plate 253 is provided inside the right chamber 250. The right cover plate 253 is provided on the inside of the inner wall where the right holes 251 are formed, inside the right chamber 150. In this case, the right cover plate 253 is provided in areas other than the front area of the right chamber 250, that is, in the center area and the rear area. Thus, since the right cover plate 253 does not cover a right chamber communication space (reference numeral not given) of the right gas exhaust part 500, the right chamber communication space communicates with the right holes 251 provided in the front area of the right chamber 250.

With the right cover plate 253, the suction force of the hopper 530 is intensively transmitted to the right holes 251 in the front area of the right chamber 250. As a result, the suction force of the right chamber 250 increases toward the front area thereof.

The right cover plate 253 includes first to third right cover plates 253a, 253b, and 253c.

The first to third right cover plates 253a, 253b, and 253c are provided inside the first to third right chambers 250a, 250b, and 250c, respectively, and are provided on the insides of the respective inner walls where the first to third right holes 251a, 251b, and 251c are formed. In this case, the first to third right cover plates 253a, 253b, and 253c are provided in areas other than the front areas of the first to third right chambers 250a, 250b, and 250c, that is, in the center areas and the rear areas. Thus, since the first to third right cover plates 253a, 253b, and 253c do not cover the first to third right chamber communication spaces 511a, 511b, and 511c of the right gas exhaust part 500, respectively, the first to third right chambers 250a, 250b, and 250c communicate with the first to third right holes 251a, 251b, and 251c provided in the front areas of the first to third right chamber communication spaces 511a, 511b, and 511c.

With the first to third right cover plates 253a, 253b, and 253c, the suction force of the hopper 530 is intensively transmitted to the first to third right holes 251a, 251b, and 251c in the front areas of the first to third right chambers 250a, 250b, and 250c. As a result, the suction force of the first to third right chambers 250a, 250b, and 250c increases toward the front areas thereof.

That is, the suction force acting through the first to third right holes 251a, 251b, and 251c of the first to third right chambers 250a, 250b, and 250c increases toward the front areas.

As described above, due to the difference in the suction force between the areas of each of the first to third right chambers 250a, 250b, and 250c, an exhaust amount of each of the first to third right chambers 250a, 250b, and 250c increases toward the front side of the wafer storage container 10.

In addition, due to the difference in the suction force between the areas of each of the first to third right chambers 250a, 250b, and 250c, as illustrated in FIG. 8, the purge gas injected from the rear chamber 230, that is, the first to third rear chambers 230a, 230b, 230c, and the left rear chamber 220, that is, the first to third left rear chambers 220a, 220b, and 220c, is intensively exhausted to the front area of the right chamber 250, that is, the front areas of the first to third right chambers 250a, 250b, and 250c. Thus, the purge gas from the rear chamber 230, that is, the first to third rear chambers 230a, 230b, 230c, and the left rear chamber 220, that is, the first to third left rear chambers 220a, 220b, and 220c, is exhausted after sufficiently flowing inside the storage chamber 100.

That is, when exhaust is made in the rear area of the right chamber 250, that is, in the rear areas of the first to third right chambers 250a, 250b, and 250c, the purge gas injected from the rear chamber 230, that is, the first to third rear chambers 230a, 230b, 230c, and the left rear chamber 220, that is, the first to third left rear chambers 220a, 220b, and 220c, is immediately exhausted to the right chamber 250, that is, the first to third right chambers 250a, 250b, and 250c. This can be prevented by the right cover plate 253, that is, the first to third right cover plates 253a, 253b, and 253c.

As described above, the wafer storage container 10 functions to exhaust an external gas together with the purge gas and fumes inside the storage chamber 100 to the front areas of the first right chamber 250a, the second right chamber 250b, and the third right chamber 250c.

Thus, inside the storage chamber 100, there is generated a flow of the purge gas in which the purge gas injected from the left surface, the left rear surface, the rear surface, and the right rear surface of the storage chamber 100 flows to the right surface (especially, the front area of the right surface) of the storage chamber 100.

Such a flow of the purge gas effectively prevents gas from the outside of the wafer storage container 10 from flowing into the wafer storage container 10, thereby preventing the wafer W from being contaminated and oxidized. Furthermore, through exhaust of the external gas by the front areas of the first right chamber 250a, the second right chamber

250b, and the third right chamber 250c, prevention of contamination and oxidation of the wafer W can be more effectively achieved.

In addition, convection between the purge gas and the external gas generated inside the storage chamber 100 can be effectively prevented.

As described above, the wafer storage container 10 according to the present disclosure exhausts the purge gas injected from a first side surface and the rear surface of the storage chamber 100 to a second side surface of the storage chamber 100. Thus, a flow of the purge gas is generated inside the storage chamber 100, and at the same time, the external gas is exhausted to the second side surface of the storage chamber 100, thereby effectively blocking the external gas from flowing into the storage chamber 100.

In addition, the flow of the purge gas inside the storage chamber 100 can prevent turbulence from being generated inside the storage chamber 100. This enables the purge gas to be injected and flow evenly over the entire wafer W, thereby minimizing dead areas on the wafer W where the purge gas is not injected. Thus, humidity control through fume removal and moisture removal for the wafer W can be more effectively achieved.

Individual (or independent) injection of the purge gas to the first purging region 100a, the second purging region 100b, and third purging region 100c, and individual (or independent) exhaust of the purge gas and fumes from the first purging region 100a, the second purging region 100b, and the third purging region 100c can be more effectively achieved by the wafers W and the shelves 600 blocking a vertical flow of the purge gas and fumes. That is, when the wafers W are supported by the shelves 600, the wafers W and the shelves 600 block the flow of the purge gas and fumes in the vertical direction, thereby enabling individual injection of the purge gas and individual exhaust of the purge gas and fumes in the vertical direction.

In the wafer storage container 10 according to the present disclosure, the purge gas is injected in the vertical direction of the storage chamber 100 individually to each of the first to third purging regions 100a, 100b, and 100c, and the purge gas and fumes are exhausted individually from each of the first to third purging regions 100a, 100b, and 100c. At the same time, the purge gas is injected in the horizontal direction individually to each of the first to third purging regions 100a, 100b, and 100c.

That is, in the wafer storage container 10 according to the present disclosure, the inside of the storage chamber 100 is divided into a plurality of regions in the vertical and horizontal directions, and the purge gas is individually injected to and exhausted from the plurality of divided regions through a plurality of chambers individually supplied with the purge gas, thereby achieving individual injection and exhaust of the purge gas inside the storage chamber 100. Thus, injection of the purge gas and exhaust of the purge gas and fumes can be performed only in a desired region.

In the wafer storage container 10 according to the present disclosure, the purge gas and fumes in the region where the wafer W having a large amount of fumes measured by a gas sensor (not illustrated) provided inside the storage chamber 100 of the wafer storage container 10 exists are intensively exhausted, thereby effectively achieving fume removal for the wafer W. In addition, the purge gas is intensively injected to the region of high humidity measured by a humidity sensor (not illustrated) provided inside the storage chamber 100 of the wafer storage container 10, thereby more effectively achieving humidity control for the wafer W.

The Control of Purge Gas Injection and Exhaust in the Storage Chamber 100 According to the Present Disclosure Hereinbelow, the control of purge gas injection and exhaust in the wafer storage container 10 according to the present disclosure will be described with reference to FIGS. 9 to 15.

The wafer W is supported by the shelf 600 and stored in the storage chamber 100, but the shelf 600 is omitted in FIGS. 9 to 15 for easy explanation.

A position sensor (not illustrated) provided inside the storage chamber 100 measures which purging region the wafer W is stored in among the first to third purging regions 100a, 100b, and 100c.

Injection and exhaust of the purge gas in the wafer storage container 10 are selectively controlled according to a "humidity control mode" in which the inside of the storage chamber 100 is filled with the purge gas by performing only injection of the purge gas, or a "fume removal mode" in which the fumes are removed by simultaneously performing injection of the purge gas and exhaust of the purge gas and fumes or performing only exhaust of the purge gas and fumes.

In the "humidity control mode", when the purge gas is injected, the purge gas is not exhausted at the same time. Thus, the inside of the storage chamber 100 is filled with the purge gas, and filling of the purge gas lowers the humidity inside the storage chamber 100, thereby controlling the humidity inside the storage chamber 100.

In the "fume removal mode", the purge gas is injected and exhausted at the same time so that the fumes remaining on the surface of the wafer W are pushed with the purge gas and then exhausted and removed, or the purge gas and fumes are exhausted only so that the fumes inside the storage chamber 100 are removed. As described above, a clean environment can be created by lowering the degree of contamination inside the storage chamber 100 through the "fume removal mode".

The control of purge gas injection and exhaust described in the following description may be applied to both the above-described "humidity control mode" and "fume removal mode".

As illustrated in FIG. 9, when wafers W are not stored in all the first to third purging regions 100a, 100b, and 100c of the storage chamber 100, the controller 900 does not inject the purge gas to all the first to third purging regions 100a, 100b, and 100c.

As described above, when the wafers W are not stored in the storage chamber 100, the purge gas is not injected from the first to third left chambers 210a, 210b, and 210c, the first to third left rear chambers 220a, 220b, and 220c, the first to third rear chambers 230a, 230b, and 230c, and the first to third right rear chambers 240a, 240b, and 240c.

As unnecessary injection and exhaust of the purge gas are not performed in a state where the wafers W are not stored, waste of the purge gas can be prevented.

When the wafers W are not stored in all the first to third purging regions 100a, 100b, and 100c of the storage chamber 100, the controller 900 exhausts the purge gas from all the first to third purging regions 100a, 100b, and 100c.

That is, the controller 900 exhausts the purge gas and fumes inside the storage chamber 100 through the first to third right chambers 250a, 250b, and 250c. This is to increase the cleanliness inside the storage chamber 100 even when the wafers W are not stored therein.

As illustrated in FIG. 10, when wafers W are stored only in the first purging region 100a among the first to third purging regions 100a, 100b, and 100c of the storage chamber 100, the controller 900 controls the injection pressure of the purge gas in the first purging region 100a to "High", controls the injection pressure of the purge gas in the second purging region 100b to "Low", and does not inject the purge gas to the third purging region 100c.

The case where the wafers W are stored only in the first purging region 100a is a case where the wafers W are supported by shelves 600 located in the first purging region 100a among the plurality of shelves 600, and also includes a case where only one wafer W is supported by a shelf 600 located in the first purging region 100a.

The injection pressure of the purge gas injected from each of the first left chamber 210a, the first left rear chamber 220a, the first rear chamber 230a, and the first right rear chamber 240a to the first purging region 100a is higher than that of the purge gas injected from each of the second left chamber 210b, the second left rear chamber 220b, the second rear chamber 230b, and the second right rear chamber 240b to the second purging region 100b. That is, the following relationship is satisfied: "the injection pressure of the purge gas injected from each of the first left chamber 210a, the first left rear chamber 220a, the first rear chamber 230a, and the first right rear chamber 240a to the first purging region 100a>the injection pressure of the purge gas injected from each of the second left chamber 210b, the second left rear chamber 220b, the second rear chamber 230b, and the second right rear chamber 240b to the second purging region 100b".

As described above, when the wafers W are supported by the shelves 600 located in the first purging region 100a, the injection pressure of the purge gas in the first purging region 100a is controlled to be higher than that of the purge gas in the second purging region 100b, thereby effectively blocking a downward flow in the EFEM from flowing into the first purging region 100a. In addition, as the purge gas is injected at a "Low" level to the second purging region 100b while the purge gas is not injected to the third purging region 100c, the downward flow is guided to the third purging region 100c farthest from the wafers W. Thus, introduction of a contaminated downward flow, that is, a contaminated external gas, into the first purging region 100a where the wafers W are located can be effectively blocked, thereby preventing contamination of the wafers W and preventing an increase in humidity of the wafers W.

When the wafers W are stored only in the first purging region 100a among the first to third purging regions 100a, 100b, and 100c of the storage chamber 100, the controller 900 controls the exhaust pressure of the purge gas in the first purging region 100a to "High", controls the exhaust pressure of the purge gas in the second purging region 100b to "Low", and does not inject the purge gas to the third purging region 100c.

The exhaust pressure of the purge gas or fumes exhausted from the first purging region 100a through the first right chamber 250a is higher than that of the purge gas or fumes exhausted from the second purging region 100b through the second right chamber 250b. That is, the following relationship is satisfied: "the exhaust pressure of the purge gas or fumes exhausted from the first purging region 100a through the first right chamber 250a>the exhaust pressure of the purge gas or fumes exhausted from the second purging region 100b through the second right chamber 250b".

As the exhaust pressure of the purge gas in the first purging region 100a is controlled to be higher than that of the purge gas in the second purging region 100b, the fumes in the first purging region 100a where the wafers W are located can be effectively removed. In addition, as exhaust of the purge gas from the second purging region 100b close to the wafers W is also maintained, a small amount of external gas and fumes introduced into the second purging region 100b can be prevented from flowing into the first purging region 100a where the wafers W are located.

As illustrated in FIG. 11, when wafers W are stored only in the second purging region 100b among the first to third purging regions 100a, 100b, and 100c of the storage chamber 100, the controller 900 controls the injection pressure of the purge gas in the first purging region 100a to "Low", controls the injection pressure of the purge gas in the second purging region 100b to "High", and controls the injection pressure of the purge gas in the third purging region 100c to "Low".

The case where the wafers W are stored only in the second purging region 100b is a case where the wafers W are supported by shelves 600 located in the second purging region 100b among the plurality of shelves 600, and also includes a case where only one wafer W is supported by a shelf 600 located in the second purging region 100b.

The injection pressure of the purge gas injected from each of the second left chamber 210b, the second left rear chamber 220b, the second rear chamber 230b, and the second right rear chamber 240b to the second purging region 100b is higher than that of the purge gas injected from each of the first left chamber 210a, the first left rear chamber 220a, the first rear chamber 230a, and the first right rear chamber 240a to the first purging region 100a, and that of the purge gas injected from each of the third left chamber 210c, the third left rear chamber 220c, the third rear chamber 230c, and the third right rear chamber 240c to the third purging region 100c. That is, the following relationship is satisfied: "the injection pressure of the purge gas injected from each of the second left chamber 210b, the second left rear chamber 220b, the second rear chamber 230b, and the second right rear chamber 240b to the second purging region 100b>the injection pressure of the purge gas injected from each of the first left chamber 210a, the first left rear chamber 220a, the first rear chamber 230a, and the first right rear chamber 240a to the first purging region 100a, and the injection pressure of the purge gas injected from each of the third left chamber 210c, the third left rear chamber 220c, the third rear chamber 230c, and the third right rear chamber 240c to the third purging region 100c".

As described above, when the wafers W are supported by the shelves 600 located in the second purging region 100b, the injection pressure of the purge gas in the second purging region 100b is controlled to be higher than that of the purge gas in the first purging region 100a and that of the purge gas in the third purging region 100c, thereby effectively blocking a downward flow in the EFEM from flowing into the second purging region 100b. Thus, introduction of a contaminated downward flow, that is, a contaminated external gas, into the second purging region 100b where the wafers W are located can be effectively blocked, thereby preventing contamination of the wafers W and preventing an increase in humidity of the wafers W. In addition, as the purge gas is injected at a "Low" level to the first purging region 100a, introduction of the downward flow concentrated in the first purging region 100a can be blocked to some extent.

When the wafers W are stored only in the second purging region 100b among the first to third purging regions 100a, 100b, and 100c of the storage chamber 100, the controller 900 controls the exhaust pressure of the purge gas in the first purging region 100a to "Low", controls the exhaust pressure of the purge gas in the second purging region 100b to "High", and controls the exhaust pressure of the purge gas in the third purging region 100c to "Low".

The exhaust pressure of the purge gas or fumes exhausted from the second purging region 100b through the second right chamber 250b is higher than that of the purge gas or fumes exhausted from the first purging region 100a through the first right chamber 250a and that of the purge gas or fumes exhausted from the third purging region 100c through the third right chamber 250c. That is, the following relationship is satisfied: "the exhaust pressure of the purge gas or fumes exhausted from the second purging region 100b through the second right chamber 250b>the exhaust pressure of the purge gas or fumes exhausted from the first purging region 100a through the first right chamber 250a and the exhaust pressure of the purge gas or fumes exhausted from the third purging region 100c through the third right chamber 250c".

As the exhaust pressure of the purge gas in the second purging region 100b is controlled to be higher than that of the purge gas in the first purging region 100a and that of the purge gas in the third purging region 100c, the fumes in the second purging region 100b where the wafers W are located can be effectively removed. In addition, as exhaust of the purge gas from the first purging region 100a and the third purging region 100c is also maintained, a small amount of external gas and fumes introduced into the first purging region 100a and the third purging region 100c can be prevented from flowing into the second purging region 100b where the wafers W are located.

As illustrated in FIG. 12, when wafers W are stored only in the third purging region 100c among the first to third purging regions 100a, 100b, and 100c of the storage chamber 100, the controller 900 does not inject the purge gas to the first purging region 100a, controls the injection pressure of the purge gas in the second purging region 100b to "Low", and controls the injection pressure of the purge gas in the third purging region 100c to "High".

The case where the wafers W are stored only in the third purging region 100c is a case where the wafers W are supported by shelves 600 located in the third purging region 100c among the plurality of shelves 600, and also includes a case where only one wafer W is supported by a shelf 600 located in the third purging region 100c.

The injection pressure of the purge gas injected from each of the third left chamber 210c, the third left rear chamber 220c, the third rear chamber 230c, and the third right rear chamber 240c to the third purging region 100c is higher than that of the purge gas injected from each of the second left chamber 210b, the second left rear chamber 220b, the second rear chamber 230b, and the second right rear chamber 240b to the second purging region 100b. That is, the following relationship is satisfied: "the injection pressure of the purge gas injected from each of the third left chamber 210c, the third left rear chamber 220c, the third rear chamber 230c, and the third right rear chamber 240c to the third purging region 100c>the injection pressure of the purge gas injected from each of the second left chamber 210b, the second left rear chamber 220b, the second rear chamber 230b, and the second right rear chamber 240b to the second purging region 100b".

As described above, when the wafers W are supported by the shelves 600 located in the third purging region 100c, the 100c is controlled to be higher than that of the purge gas in the second purging region 100b, thereby effectively blocking a downward flow in the EFEM from flowing into the third purging region 100c. In addition, as the purge gas is injected at a "Low" level to the second purging region 100b while the purge gas is not injected to the first purging region 100a, the downward flow is guided to the first purging region 100a farthest from the wafers W. Thus, introduction of a contaminated downward flow, that is, a contaminated external gas, into the third purging region 100c where the wafers W are located can be effectively blocked, thereby preventing contamination of the wafers W and preventing an increase in humidity of the wafers W.

When the wafers W are stored only in the third purging region 100c among the first to third purging regions 100a, 100b, and 100c of the storage chamber 100, the controller 900 does not exhaust the purge gas from the first purging region 100a, controls the exhaust pressure of the purge gas in the second purging region 100b to "Low", and controls the exhaust pressure of the purge gas in the third purging region 100c to "High".

The exhaust pressure of the purge gas or fumes exhausted from the third purging region 100c through the third right chamber 250c is higher than that of the purge gas or fumes exhausted from the second purging region 100b through the second right chamber 250b. That is, the following relationship is satisfied: "the exhaust pressure of the purge gas or fumes exhausted from the third purging region 100c through the first right chamber 250a>the exhaust pressure of the purge gas or fumes exhausted from the second purging region 100b through the second right chamber 250b".

As the exhaust pressure of the purge gas in the third purging region 100c is controlled to be higher than that of the purge gas in the second purging region 100b, the fumes in the third purging region 100c where the wafers W are located can be effectively removed. In addition, as exhaust of the purge gas from the second purging region 100b close to the wafers W is also maintained, a small amount of external gas and fumes introduced into the second purging region 100b can be prevented from flowing into the third purging region 100c where the wafers W are located.

As illustrated in FIG. 13, when wafers W are not stored in the third purging region 100c but stored only in the first purging region 100a and the second purging region 100b among the first to third purging regions 100a, 100b, and 100c of the storage chamber 100, the controller 900 controls the injection pressure of the purge gas in the first purging region 100a to "Normal", controls the injection pressure of the purge gas in the second purging region 100b to "High", and controls the 100c to "Low".

The case where the wafers W are stored only in the first purging region 100a and the second purging region 100b is a case where the wafers W are supported by shelves 600 located in the first purging region 100a and the second purging region 100b among the plurality of shelves 600, and also includes a case where only one wafer W is supported by a shelf 600 located in the first purging region 100a while only one wafer W is supported by a shelf 600 located in the second purging region 100b.

The injection pressure of the purge gas injected from each of the first left chamber 210a, the first left rear chamber 220a, the first rear chamber 230a, and the first right rear chamber 240a to the first purging region 100a is lower than that of the purge gas injected from each of the second left chamber 210b, the second left rear chamber 220b, the second rear chamber 230b, and the second right rear chamber 240b to the second purging region 100b, and is higher than that of the purge gas injected from each of the third left chamber 210c, the third left rear chamber 220c, the third rear chamber 230c, and the third right rear chamber 240c to the third purging region 100c. That is, the following relationship is satisfied: "the injection pressure of the purge gas injected from each of the second left chamber 210*b*, the second left rear chamber 220*b*, the second rear chamber 230*b*, and the second right rear chamber 240*b* to the second purging region 100*b*>the injection pressure of the purge gas injected from each of the first left chamber 210*a*, the first left rear chamber 220*a*, the first rear chamber 230*a*, and the first right rear chamber 240*a* to the first purging region 100*a*>the injection pressure of the purge gas injected from each of the third left chamber 210*c*, the third left rear chamber 220*c*, the third rear chamber 230*c*, and the third right rear chamber 240*c* to the third purging region 100*c*".

As described above, when the wafers W are supported by the shelves 600 located in the first purging region 100*a* and the second purging region 100*b*, the injection pressure of the purge gas in the second purging region 100*b* is controlled to be higher than that of the purge gas in the first purging region 100*a* and that of the purge gas in the third purging region 100*c*, thereby effectively blocking a downward flow in the EFEM from flowing into the second purging region 100*b*. In addition, as the injection pressure of the purge gas in the first purging region 100*a* is controlled to be lower than that of the purge gas in the second purging region 100*b*, but higher than that of the purge gas in the third purging region 100*c*, the downward flow in the EFEM can be blocked from flowing into the first purging region 100*a*.

Thus, introduction of a contaminated downward flow, that is, a contaminated external gas, into the first purging region 100*a* and the second purging region 100*b* where the wafers W are located can be effectively blocked, thereby preventing contamination of the wafers W and preventing an increase in humidity of the wafers W.

In addition, as the purge gas is injected at a "High" level to the second purging region 100*b*, the flow direction of the downward flow concentrated in the first purging region 100*a* is changed. This prevents the downward flow from being concentrated in the first purging region 100*a*, thereby more effectively blocking the downward flow from flowing into both the first purging region 100*a* and the second purging region 100*b*.

In detail, when the injection pressure of the purge gas in the first purging region 100*a* is higher than that of the purge gas in the second purging region 100*b*, the flow direction of the downward flow may be changed to the direction toward the second purging region 100*b*, so that the downward flow may flow into the second purging region 100*b*. However, as described above, by controlling the injection pressure of the purge gas in the second purging region 100*b* to be higher than that of the purge gas in the first purging region 100*a*, the flow direction of the downward flow is changed to the direction toward the lower area of the wafer transfer chamber, thereby effectively preventing the downward flow from flowing into both the first purging region 100*a* and the second purging region 100*b*.

When the wafers W are not stored in the third purging region 100*c* but stored only in the first purging region 100*a* and the second purging region 100*b* among the first to third purging regions 100*a*, 100*b*, and 100*c* of the storage chamber 100, the controller 900 controls the exhaust pressure of the purge gas in the first purging region 100*a* to "Normal", controls the exhaust pressure of the purge gas in the second purging region 100*b* to "High", and controls the exhaust pressure of the purge gas in the third purging region 100*c* to "Low".

The exhaust pressure of the purge gas or fumes exhausted from the first purging region 100*a* through the first right chamber 250*a* is lower than that of the purge gas or fumes exhausted from the second purging region 100*b* through the second right chamber 250*b*, and is higher than that of the purge gas or fumes exhausted from the third purging region 100*c* through the third right chamber 250*c*. That is, the following relationship is satisfied: "the exhaust pressure of the purge gas or fumes exhausted from the second purging region 100*b* through the second right chamber 250*b*>the exhaust pressure of the purge gas or fumes exhausted from the first purging region 100*a* through the first right chamber 250*a*>the exhaust pressure of the purge gas or fumes exhausted from the third purging region 100*c* through the third right chamber 250*c*".

As the exhaust pressure of the purge gas in the second purging region 100*b* is controlled to be higher than that of the purge gas in the first purging region 100*a* and that of the purge gas in the third purging region 100*c*, the fumes in the second purging region 100*b* where the wafers W are located can be effectively removed.

In addition, as the exhaust pressure of the purge gas in the first purging region 100*a* is controlled to be second highest, the downward flow concentrated in the first purging region 100*a* where the wafers W are located is exhausted, thereby effectively blocking introduction of the downward flow.

In addition, as exhaust of the purge gas from the third purging region 100*c* is also maintained, a small amount of external gas and fumes introduced into the third purging region 100*c* can be prevented from flowing into the first purging region 100*a* and the second purging region 100*b* where the wafers W are located.

As illustrated in FIG. 14, when wafers W are not stored in the first purging region 100*a* but stored only in the second purging region 100*b* and the third purging region 100*c* among the first to third purging regions 100*a*, 100*b*, and 100*c* of the storage chamber 100, the controller 900 controls the injection pressure of the purge gas in the first purging region 100*a* to "Low", controls the injection pressure of the purge gas in the second purging region 100*b* to "High", and controls the 100*c* to "Normal".

The case where the wafers W are stored only in the second purging region 100*b* and the third purging region 100*c* is a case where the wafers W are supported by shelves 600 located in in the second purging region 100*b* and the third purging region 100*c* among the plurality of shelves 600, and also includes a case where only one wafer W is supported by a shelf 600 located in the second purging region 100*b* while only one wafer W is supported by a shelf 600 located in the third purging region 100*c*.

The injection pressure of the purge gas injected from each of the third left chamber 210*c*, the third left rear chamber 220*c*, the third rear chamber 230*c*, and the third right rear chamber 240*c* to the third purging region 100*c* is lower than that of the purge gas injected from each of the second left chamber 210*b*, the second left rear chamber 220*b*, the second rear chamber 230*b*, and the second right rear chamber 240*b* to the second purging region 100*b*, and is higher than that of the purge gas injected from each of the first left chamber 210*a*, the first left rear chamber 220*a*, the first rear chamber 230*a*, and the first right rear chamber 240*a* to the first purging region 100*a*.

That is, the following relationship is satisfied: "the injection pressure of the purge gas injected from each of the second left chamber 210*b*, the second left rear chamber 220*b*, the second rear chamber 230*b*, and the second right rear chamber 240*b* to the second purging region 100*b*>the injection pressure of the purge gas injected from each of the third left chamber 210*c*, the third left rear chamber 220*c*, the third rear chamber 230*c*, and the third right rear chamber 240*c* to the third purging region 100*c*>the injection pressure of the purge gas injected from each of the first left chamber 210a, the first left rear chamber 220a, the first rear chamber 230a, and the first right rear chamber 240a to the first purging region 100a".

As described above, when the wafers W are supported by the shelves 600 located in the second purging region 100b and the third purging region 100c, the injection pressure of the purge gas in the second purging region 100b is controlled to be higher than that of the purge gas in the first purging region 100a and that of the purge gas in the third purging region 100c, thereby effectively blocking a downward flow in the EFEM from flowing into the second purging region 100b. In addition, as the injection pressure of the purge gas in the third purging region 100c is controlled to be lower than that of the purge gas in the second purging region 100b, but higher than that of the purge gas in the first purging region 100a, the downward flow in the EFEM can be blocked from flowing into the third purging region 100c.

Thus, introduction of a contaminated downward flow, that is, a contaminated external gas, into the second purging region 100b and the third purging region 100c where the wafers W are located can be effectively blocked, thereby preventing contamination of the wafers W and preventing an increase in humidity of the wafers W.

When the wafers W are not stored in the first purging region 100a but stored only in the second purging region 100b and the third purging region 100c among the first to third purging regions 100a, 100b, and 100c of the storage chamber 100, the controller 900 controls the exhaust pressure of the purge gas in the first purging region 100a to "Low", controls the exhaust pressure of the purge gas in the second purging region 100b to "High", and controls the exhaust pressure of the purge gas in the third purging region 100c to "Normal".

The exhaust pressure of the purge gas or fumes exhausted from the third purging region 100c through the third right chamber 250c is lower than that of the purge gas or fumes exhausted from the second purging region 100b through the second right chamber 250b, and is higher than that of the purge gas or fumes exhausted from the first purging region 100a through the first right chamber 250a.

That is, the following relationship is satisfied: "the exhaust pressure of the purge gas or fumes exhausted from the second purging region 100b through the second right chamber 250b>the exhaust pressure of the purge gas or fumes exhausted from the third purging region 100c through the third right chamber 250c>the exhaust pressure of the purge gas or fumes exhausted from the first purging region 100a through the first right chamber 250a".

As the exhaust pressure of the purge gas in the second purging region 100b is controlled to be higher than that of the purge gas in the first purging region 100a and that of the purge gas in the third purging region 100c, the fumes in the second purging region 100b where the wafers W are located can be effectively removed.

In addition, as the exhaust pressure of the purge gas in the third purging region 100c is controlled to be second highest, the downward flow concentrated in the third purging region 100c where the wafers W are located is exhausted, thereby effectively blocking introduction of the downward flow.

In addition, as exhaust of the purge gas from the first purging region 100a is also maintained, a small amount of external gas and fumes introduced into the first purging region 100a can be prevented from flowing into the second purging region 100b and the third purging region 100c where the wafers W are located.

As illustrated in FIG. 15, when wafers W are stored in all the first to third purging regions 100a, 100b, and 100c of the storage chamber 100, the controller 900 controls the injection pressure of the purge gas in each of the first to third purging regions 100a, 100b, and 100c to "Normal".

The case where the wafers W are stored in all the first to third purging regions 100a, 100b, and 100c also includes a case where one wafer W is supported by a shelf 600 in each of the first to third purging regions 100a, 100b, and 100c.

The injection pressure of the purge gas injected from each of the first left chamber 210a, the first left rear chamber 220a, the first rear chamber 230a, and the first right rear chamber 240a to the first purging region 100a is equal to that of the purge gas injected from each of the second left chamber 210b, the second left rear chamber 220b, the second rear chamber 230b, and the second right rear chamber 240b to the second purging region 100b, and to that of the purge gas injected from each of the third left chamber 210c, the third left rear chamber 220c, the third rear chamber 230c, and the third right rear chamber 240c to the third purging region 100c.

That is, the following relationship is satisfied: "the injection pressure of the purge gas injected from each of the first left chamber 210a, the first left rear chamber 220a, the first rear chamber 230a, and the first right rear chamber 240a to the first purging region 100a=the injection pressure of the purge gas injected from each of the second left chamber 210b, the second left rear chamber 220b, the second rear chamber 230b, and the second right rear chamber 240b to the second purging region 100b=the injection pressure of the purge gas injected from each of the third left chamber 210c, the third left rear chamber 220c, the third rear chamber 230c, and the third right rear chamber 240c to the third purging region 100c".

As described above, as the injection pressure of the purge gas is maintained the same in all the first to third purging regions 100a, 100b, and 100c, introduction of the downward flow into the region where the wafers W are located can be minimized and at the same time, humidity control for all the wafers W can be effectively achieved.

When the wafers W are stored in all the first to third purging regions 100a, 100b, and 100c of the storage chamber 100, the controller 900 controls the exhaust pressure of the purge gas in each of the first to third purging regions 100a, 100b, and 100c to "Normal".

The exhaust pressure of the purge gas injected from each of the first left chamber 210a, the first left rear chamber 220a, the first rear chamber 230a, and the first right rear chamber 240a to the first purging region 100a is equal to that of the purge gas injected from each of the second left chamber 210b, the second left rear chamber 220b, the second rear chamber 230b, and the second right rear chamber 240b to the second purging region 100b, and to that of the purge gas injected from each of the third left chamber 210c, the third left rear chamber 220c, the third rear chamber 230c, and the third right rear chamber 240c to the third purging region 100c.

That is, the following relationship is satisfied: "the exhaust pressure of the purge gas injected from each of the first left chamber 210a, the first left rear chamber 220a, the first rear chamber 230a, and the first right rear chamber 240a to the first purging region 100a=the exhaust pressure of the purge gas injected from each of the second left chamber 210b, the second left rear chamber 220b, the second rear chamber 230b, and the second right rear chamber 240b to the second purging region 100b=the exhaust pressure of the purge gas injected from each of the third left chamber 210c, the third left rear chamber 220c, the third rear chamber 230c, and the third right rear chamber 240c to the third purging region 100c".

As the injection pressure of the purge gas is maintained the same in all the first to third purging regions 100a, 100b, and 100c, the downward flow and fumes introduced into the region where the wafers W are located can be effectively exhausted, thereby ensuring high cleanliness inside the storage chamber 100.

As described above, the wafer storage container 10 according to the present disclosure controls injection and exhaust of the purge gas according to the position of the wafer W, thereby effectively preventing the downward flow in the wafer transfer chamber of the EFEM from flowing into the wafer storage container 10 and thus preventing the wafer W from being damaged due to high humidity and fumes.

Although the exemplary embodiment of the present disclosure has been described for illustrative purposes, those skilled in the art will appreciate that various modifications, additions, and substitutions are possible, without departing from the scope and spirit of the present disclosure as disclosed in the accompanying claims.

What is claimed is:

1. A wafer storage container, the wafer storage container comprising:
    a storage chamber having a front opening at a front side thereof, configured to store therein, through the front opening, a plurality of wafers, and having an inside divided in a vertical direction into a first purging region and a second purging region located above the first purging region;
    a plurality of shelves provided in the vertical direction inside the storage chamber to support the plurality of wafers;
    first and second injection chambers forming an inner side surface of the storage chamber, corresponding to the first and second purging regions, respectively, having a plurality of first injection holes and a plurality of second injection holes on respective inner surfaces thereof, respectively, and configured to individually receive a purge gas and individually inject the purge gas into the first and second purging regions, through the plurality of first injection holes and the plurality of second injection holes, respectively;
    first and second exhaust chambers forming a side surface of the storage chamber, corresponding to the first and second purging regions, respectively, having a plurality of first exhaust holes and a plurality of second exhaust holes on respective inner surfaces thereof, respectively, and configured to individually exhaust a purge gas from the first and second purging regions, respectively, through the plurality of first exhaust holes and the plurality of second exhaust holes, respectively;
    first and second exhaust chamber communication spaces being located at heights corresponding to the first and second exhaust chambers, respectively, disposed on a side of the respective exhaust chambers, and in fluid communication with the respective exhaust chambers;
    a hopper disposed on an outer side surface of the storage chamber and connected to an external exhaust line; and
    first and second valves located at first and second heights corresponding to the first and second exhaust chambers, respectively, and configured to selectively connect the respective exhaust chamber communication spaces to the hopper, and to selectively transmit suction force of the external exhaust line to the first and second exhaust chambers by opening and closing.

2. The wafer storage container of claim 1, further comprising:
    a controller configured to control an injection pressure of the purge gas injected from each of the first and second injection chambers, according to which purging region a wafer is stored in among the first and second purging regions,
    wherein the inside of the storage chamber is divided into the first purging region, the second purging region, and a third purging region located above the second purging region,
    the wafer storage container further comprises a third injection chamber forming an inner side of the storage chamber, corresponding to the third purging region, having a plurality of third injection holes on an inner surface thereof, and configured to individually receive the purge gas and individually inject the purge gas to the third purging region through the plurality of third injection holes, and
    the controller controls an injection pressure of the purge gas injected from each of the first to third injection chambers, according to which purging region the wafer is stored in among the first to third purging regions.

3. The wafer storage container of claim 2, wherein when the wafer is stored only in the first purging region among the first to third purging regions, the purge gas is not injected from the third injection chamber to the third purging region, and the injection pressure of the purge gas injected from the first injection chamber to the first purging region is higher than that of the purge gas injected from the second injection chamber to the second purging region.

4. The wafer storage container of claim 2, wherein when the wafer is stored only in the second purging region among the first to third purging regions, the injection pressure of the purge gas injected from the second injection chamber to the second purging region is higher than that of the purge gas injected from the first injection chamber to the first purging region and that of the purge gas from the third injection chamber to the third purging region.

5. The wafer storage container of claim 2, wherein when the wafer is stored only in the third purging region among the first to third purging regions, the purge gas is not injected from the first injection chamber to the first purging region, and the injection pressure of the purge gas injected from the third injection chamber to the third purging region is higher than that of the purge gas injected from the second injection chamber to the second purging region.

6. The wafer storage container of claim 2, wherein when the wafer is not stored in the third purging region but stored only in the first purging region and the second purging region among the first to third purging regions, the following relationship is satisfied: the injection pressure of the purge gas injected from the second rear injection chamber to the second purging region>the injection pressure of the purge gas injected from the first rear injection chamber to the first purging region>the injection pressure of the purge gas injected from the third rear injection chamber to the third purging region.

7. The wafer storage container of claim 2, wherein when the wafer is not stored in the first purging region but stored only in the second purging region and the third purging region among the first to third purging regions, the following relationship is satisfied: the injection pressure of the purge gas injected from the second rear injection chamber to the second purging region>the injection pressure of the purge gas injected from the third rear injection chamber to the third purging region>the injection pressure of the purge gas injected from the first rear injection chamber to the first purging region.

8. The wafer storage container of claim 1,
wherein the first and second injection chambers are provided on a left surface of the storage chamber, and
wherein the wafer storage container further comprises a controller configured to control an injection pressure of the purge gas injected from each of the first and second injection chambers and an exhaust pressure of the purge gas exhausted through each of the first and second exhaust chambers, according to which purging region the wafer is stored in among the first and second purging regions.

9. The wafer storage container of claim 8, wherein the inside of the storage chamber is divided into the first purging region, the second purging region, and a third purging region located above the second purging region,
the wafer storage container further comprises:
a third injection chamber forming a left surface of the storage chamber, corresponding to the third purging region, having a plurality of third injection holes on an inner surface thereof, and configured to individually receive the purge gas and individually inject the purge gas to the third purging region through the plurality of third injection holes; and
a third exhaust chamber forming a right surface of the storage chamber, corresponding to the third purging region, having a plurality of third exhaust holes on an inner surface thereof, and configured to individually exhaust the purge gas in the third purging region through the plurality of third exhaust holes, and
the controller controls an injection pressure of the purge gas injected from each of the first to third injection chambers and an exhaust pressure of the purge gas exhausted through each of the first to third exhaust chambers, according to which purging region the wafer is stored in among the first to third purging regions.

10. The wafer storage container of claim 9, further comprising:
first to third left rear chambers forming a left rear surface of the storage chamber, corresponding to the first to third purging regions, respectively, having a plurality of first left rear holes, a plurality of second left rear holes, and a plurality of third left rear holes on respective inner surfaces thereof, respectively, and configured to individually receive the purge gas and individually inject the purge gas to the first to third purging regions, respectively, through the plurality of first left rear holes, the plurality of second left rear holes, and the plurality of third left rear holes, respectively; and
first to third right rear chambers forming a right rear surface of the storage chamber, corresponding to the first to third purging regions, respectively, having a plurality of first right rear holes, a plurality of second right rear holes, and a plurality of third right rear holes on respective inner surfaces thereof, respectively, and configured to individually receive the purge gas and individually inject the purge gas to the first to third purging regions, respectively, through the plurality of first right rear holes, the plurality of second right rear holes, and the plurality of third right rear holes, respectively, and
the controller controls an injection pressure of the purge gas injected from each of the first to third left rear chambers and an injection pressure of the purge gas injected from each of the first to third right rear chambers, according to which purging region the wafer is stored in among the first to third purging regions.

11. The wafer storage container of claim 10, wherein the left rear chamber has a shape inclined right toward a rear side of the storage chamber, and the right rear chamber has a shape inclined left toward the rear side of the storage chamber.

12. The wafer storage container of claim 1, wherein the first and second exhaust chambers form a right side surface of the storage chamber, and the first and second exhaust chamber communication spaces are disposed on a right side of the respective exhaust chambers.

* * * * *